(12) United States Patent
Gao et al.

(10) Patent No.: US 11,581,475 B2
(45) Date of Patent: Feb. 14, 2023

(54) PREPARATION METHOD AND DEVICE OF INDUCTANCE ELEMENT, INDUCTANCE ELEMENT, AND SUPERCONDUCTING CIRCUIT

(71) Applicant: ALIBABA GROUP HOLDING LIMITED, Grand Cayman (KY)

(72) Inventors: Ran Gao, Hangzhou (CN); Jingwei Zhou, Hangzhou (CN); Chunqing Deng, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 0 days.

(21) Appl. No.: 17/324,864

(22) Filed: May 19, 2021

(65) Prior Publication Data
US 2021/0367131 A1 Nov. 25, 2021

(30) Foreign Application Priority Data
May 20, 2020 (CN) .......................... 202010431535.X

(51) Int. Cl.
| | |
|---|---|
| *H01L 39/24* | (2006.01) |
| *H01L 27/18* | (2006.01) |
| *H01L 39/02* | (2006.01) |
| *H01L 39/12* | (2006.01) |
| *H01L 39/22* | (2006.01) |

(52) U.S. Cl.
CPC .......... *H01L 39/2493* (2013.01); *H01L 27/18* (2013.01); *H01L 39/025* (2013.01); *H01L 39/125* (2013.01); *H01L 39/223* (2013.01)

(58) Field of Classification Search
CPC ... H01L 39/2493; H01L 27/18; H01L 39/025; H01L 39/125; H01L 39/223
See application file for complete search history.

(56) References Cited

U.S. PATENT DOCUMENTS

| | | | |
|---|---|---|---|
| 2008/0050528 A1* | 2/2008 | McCleskey | ............. C23C 26/00 427/372.2 |
| 2018/0216224 A1* | 8/2018 | Stiens | ..................... C23C 16/56 |

FOREIGN PATENT DOCUMENTS

| | | |
|---|---|---|
| CN | 110462857 A | 11/2019 |
| CN | 110998853 A | 4/2020 |

OTHER PUBLICATIONS

Mayrhofer. Paul H. "self-organize nanostructure in Ti—Al—N system," Appl. Phys. Lett. 83, 2049 (2003) https://aip.scitation.org/doi/abs/10.1063/1.1608464 (Year: 2003).*

(Continued)

*Primary Examiner* — Matthew L Reames
(74) *Attorney, Agent, or Firm* — Finnegan, Henderson, Farabow, Garrett & Dunner, LLP

(57) ABSTRACT

A method and a device for preparing an inductance element, an inductance element, and a superconducting circuit are provided. The method includes acquiring a compound for preparing an inductance element, a superconducting coherence length and a magnetic field penetration depth of the compound meeting a preset condition; and annealing the compound to cause decomposition between a non-superconductor phase and a superconductor phase in the compound to generate the inductance element, the kinetic inductance of the inductance element being greater than the geometric inductance of the inductance element.

23 Claims, 12 Drawing Sheets

(56) References Cited

OTHER PUBLICATIONS

Zhou et al. "Phase equilibria, thermodynamics and microstructure simulation of metastable spinodal decomposition in c—Ti1—xAlxN coatings," Calphad vol. 56, Mar. 2017, pp. 92-101 (Year: 2017).*

Valenti et al ," nterplay Between Kinetic Inductance, Nonlinearity, and Quasiparticle Dynamics in Granular Aluminum Microwave Kinetic Inductance Detectors," Phys. Rev. Applied 11, 054087—Published May 31, 2019 (Year: 2019).*

Gao et al., U"ltrahigh-inductance materials from spinodal decomposition," arXiv:2111.05088v1 (Year: 2021).*

* cited by examiner

PREPARATION METHOD AND DEVICE OF INDUCTANCE ELEMENT, INDUCTANCE ELEMENT, AND SUPERCONDUCTING CIRCUIT

CROSS-REFERENCE TO RELATED APPLICATIONS

This application claims priority to Chinese Application 202010431535.X, filed on May 20, 2020, the content of which is incorporated herein by reference in its entirety.

TECHNICAL FIELD

The present disclosure relates to the technical field of superconducting materials, in particular to a preparation method and a device for preparing an inductance element, an inductance element, and a superconducting circuit.

BACKGROUND

An inductance element with high kinetic inductance and no loss is a necessary component for preparing superconducting magnetic flux quantum bits. Existing methods for preparing an inductance element with high kinetic inductance can include preparing multiple (e.g., about 100) Josephson junctions in series using a first type of superconductors. The first type of superconductors in this disclosure refers to superconductors with superconducting coherence length greater than their magnetic field penetration depth. After generating the multiple Josephson junctions in series, because of the structural characteristics of the Josephson junctions, the carrier density can fluctuate in long range, which can break the long-range order of the superconductors, thus enhancing the dynamic inductance of the superconductors.

However, the above preparation methods can be relatively complicated. Also, when the Josephson junctions are connected in series to form an array, they tend to introduce a parasitic resonance modulus, thereby reducing the accuracy and reliability of measurement of superconducting quantum bits.

SUMMARY OF THE DISCLOSURE

Embodiments of the present disclosure provide a method and a device for preparing an inductance element, an inductance element, and a superconducting circuit are provided.

In an aspect, a method of preparing an inductance element includes acquiring a compound for preparing an inductance element, a superconducting coherence length and a magnetic field penetration depth of the compound meeting a preset condition; and annealing the compound to cause decomposition between a non-superconductor phase and a superconductor phase in the compound to generate the inductance element, the kinetic inductance of the inductance element being greater than the geometric inductance of the inductance element.

In another aspect, an inductance element prepared using a method is provided. The method includes acquiring a compound for preparing an inductance element, a superconducting coherence length and a magnetic field penetration depth of the compound meeting a preset condition; and annealing the compound to cause decomposition between a non-superconductor phase and a superconductor phase in the compound to generate the inductance element, the kinetic inductance of the inductance element being greater than the geometric inductance of the inductance element.

In yet another aspect, a superconducting circuit including an inductance element is provided. The inductance element is prepared using a method that includes acquiring a compound for preparing an inductance element, a superconducting coherence length and a magnetic field penetration depth of the compound meeting a preset condition; and annealing the compound to cause decomposition between a non-superconductor phase and a superconductor phase in the compound to generate the inductance element, the kinetic inductance of the inductance element being greater than the geometric inductance of the inductance element.

In yet another aspect, a quantum chip including an inductance element is provided. The inductance element is prepared using a method that includes acquiring a compound for preparing an inductance element, a superconducting coherence length and a magnetic field penetration depth of the compound meeting a preset condition; and annealing the compound to cause decomposition between a non-superconductor phase and a superconductor phase in the compound to generate the inductance element, the kinetic inductance of the inductance element being greater than the geometric inductance of the inductance element.

In yet another aspect, a device for preparing an inductance element includes a memory configured to store one or more computer-readable instructions and a processor. When the one or more computer-readable computer instructions are executed by the processor, the processor causes the device to perform a method. The method includes acquiring a compound for preparing an inductance element, a superconducting coherence length and a magnetic field penetration depth of the compound meeting a preset condition; and annealing the compound to cause decomposition between a non-superconductor phase and a superconductor phase in the compound to generate the inductance element, the kinetic inductance of the inductance element being greater than the geometric inductance of the inductance element.

In yet another aspect, a method for parameter configuration includes acquiring an execution operation for an annealing control parameter, the annealing control parameter being used to anneal a compound for preparing an inductance element; and adjusting the annealing control parameter based on the execution operation to obtain a target annealing control parameter, so that when the compound is annealed using the target annealing control parameter, decomposition is caused between a non-superconductor phase and a superconductor phase in the compound to generate the inductance element, the kinetic inductance of the inductance element being greater than the geometric inductance of the inductance element.

In yet another aspect, a non-transitory computer-readable medium is provided. The non-transitory computer-readable medium stores a set of instructions that is executable by at least one processor of an apparatus to cause the apparatus to perform a method. The method includes acquiring an execution operation for an annealing control parameter, the annealing control parameter being used to anneal a compound for preparing an inductance element; and adjusting the annealing control parameter based on the execution operation to obtain a target annealing control parameter, so that when the compound is annealed using the target annealing control parameter, decomposition is caused between a non-superconductor phase and a superconductor phase in the compound to generate the inductance element, the kinetic inductance of the inductance element being greater than the geometric inductance of the inductance element.

In yet another aspect, an apparatus for parameter configuration includes an acquisition module configured to acquire an execution operation for an annealing control parameter, the annealing control parameter being used to anneal a compound for preparing an inductance element. The apparatus further includes an adjustment module configured to configure the annealing control parameter based on the execution operation to obtain a target annealing control parameter, so that when the compound is annealed using the target annealing control parameter, decomposition is caused between a non-superconductor phase and a superconductor phase in the compound to generate the inductance element, the kinetic inductance of the inductance element being greater than the geometric inductance of the inductance element.

In yet another aspect, an electronic device is provided. The electronic device includes a memory configured to store one or more computer-readable instructions and a processor. When the one or more computer-readable computer instructions are executed by the processor, the processor causes the device to perform a method. The method includes acquiring an execution operation for an annealing control parameter, the annealing control parameter being used to anneal a compound for preparing an inductance element; and adjusting the annealing control parameter based on the execution operation to obtain a target annealing control parameter, so that when the compound is annealed using the target annealing control parameter, decomposition is caused between a non-superconductor phase and a superconductor phase in the compound to generate the inductance element, the kinetic inductance of the inductance element being greater than the geometric inductance of the inductance element.

BRIEF DESCRIPTION OF THE DRAWINGS

To describe the technical solutions in the embodiments of the present disclosure, the accompanying drawings are briefly introduced below. It is apparent that the accompanying drawings described herein are some embodiments of the present disclosure, and those of ordinary skill in the art can still derive other drawings from these accompanying drawings without creative efforts.

DETAILED DESCRIPTION

Figure 1:
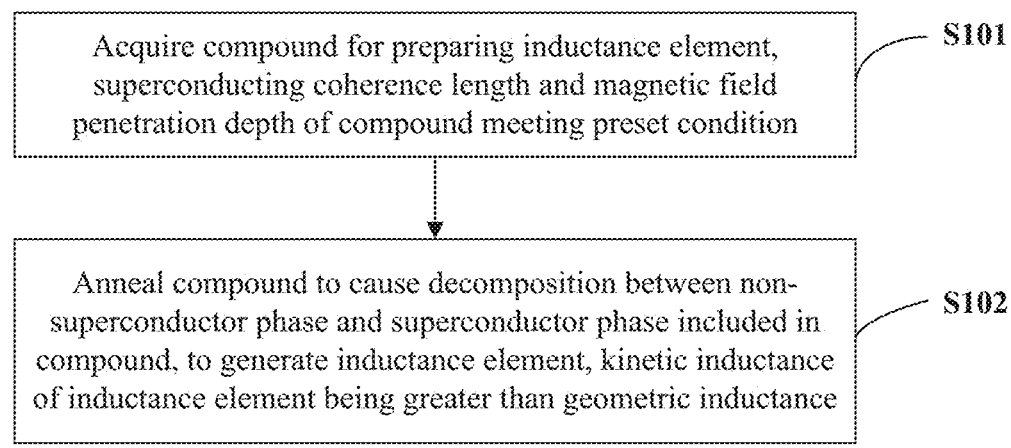
FIG. 1 is a flowchart of an example method of preparing an inductance element, consistent with some embodiments of this disclosure.

Technical solutions disclosed in the embodiments of the present disclosure can be described with reference to the accompanying drawings in the embodiments of the present disclosure. It is apparent that the described embodiments are merely some of, rather than all, the embodiments of the present disclosure. Based on the embodiments of the present disclosure, all other embodiments derived by those of ordinary skill in the art without creative efforts fall within the protection scope of the present disclosure.

The terms used in the embodiments of the present disclosure are for the purpose of describing particular embodiments only, and are not intended to limit the present disclosure. The singular forms "a," "said," and "the" used in the embodiments of the present disclosure and the appended claims are also intended to include plural forms, unless other meanings are clearly indicated in the context. "Plurality" includes at least two. In addition, references to "one embodiment" are not intended to be interpreted as excluding the existence of additional embodiments that also incorporate the recited features. It should be noted that, the relational terms herein such as "first" and "second" are used only to differentiate an entity or operation from another entity or operation, and do not require or imply any actual relationship or sequence between these entities or operations. It should be understood that the data used in this way can be interchanged under appropriate circumstances so that the embodiments of the present disclosure described herein can be implemented in an order other than those illustrated or described herein.

It should be understood that the term "and/or" used herein is only an association relationship describing associated objects, which means that there can be three relationships. For example, A and/or B can mean three cases that A exists alone, both A and B exist, and B exists alone. In addition, the character "/" herein generally means that the associated objects before and after it are in an "or" relationship. As used herein, unless specifically stated otherwise, the term "or" encompasses all possible combinations, except where infeasible. For example, if it is stated that a component can include A or B, then, unless specifically stated otherwise or infeasible, the component can include A, or B, or A and B. As a second example, if it is stated that a component can include A, B, or C, then, unless specifically stated otherwise or infeasible, the component can include A, or B, or C, or A and B, or A and C, or B and C, or A and B and C.

Depending on the context, the words "if" and "supposing" as used herein can be interpreted as "at the time of" or "when" or "in response to determination" or "in response to detection." Similarly, depending on the context, the phrase "if determined" or "if detected (stated condition or event)" can be interpreted as "when determined" or "in response to determination" or "when detected (stated condition or event)" or "in response to detection (stated condition or event)."

Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. In the absence of more limitations, an element defined by "including a/an . . . " does not exclude that the commodity or system including the element further has other identical elements. As another example, a process, method, system, product, or device that includes a series of steps or units is not necessarily limited to the clearly listed steps or units, and can include other steps or units that are not clearly listed or are inherent to the process, method, product, or device.

To make the objectives, technical solutions, and advantages of the embodiments of the present disclosure clearer, the technical solutions in the embodiments of the present disclosure will be described clearly and completely with reference to the accompanying drawings in the embodiments of the present disclosure. It is apparent that the described embodiments are merely some of, rather than all, the embodiments of the present disclosure. Based on the embodiments of the present disclosure, all other embodiments derived by those of ordinary skill in the art without creative efforts fall within the protection scope of the present disclosure. In addition, the sequence of method steps in this disclosure is only an example, and is not strictly limited.

In this disclosure, "kinetic inductance" refers to a high-frequency inductance effect caused by the inertia of carriers in high-conductivity materials (e.g., superconductors). "Geometric inductance" refers to an inductance determined by a geometrical shape of a superconductor. Typically, the geometric inductance can be limited by a fine structure constant $\alpha$. "Spinodal decomposition" refers to spontaneous decomposition that occurs when a cooled mixture solid solution is in a situation where the components are unstable. "Aluminum titanium nitride" ($Ti_xAl_{(1-x)}N$) refers to a nitride of titanium aluminum alloy, in which an atomic ratio of titanium is x, and an atomic ratio of aluminum is 1−x, where 0<x<1. "Titanium nitride" (TiN) refers to a type of superconductor. "Aluminum nitride" (AlN) refers to a type of insulator. "Granular aluminum" refers to an aluminum film composed of small granular aluminum coated with aluminum oxide.

Typically, an inductance element with high kinetic inductance and no loss can be used as a component for preparing superconducting quantum bits, and can be applied to quantum sensors and quantum information processors. In general, the geometric inductance of an inductance element is limited by the fine structure constant $\alpha$, and a relatively high kinetic inductance ("superinductance") is usually the kinetic inductance generated by the inertia of charged carriers.

Existing methods for preparing an inductance element with high kinetic inductance can include the following modes. In a first mode, multiple (e.g., about 100) Josephson junctions in series can be prepared using a first type of superconductors. The first type of superconductors in this disclosure refers to superconductors with superconducting coherence length greater than their magnetic field penetration depth. After generating the multiple Josephson junctions in series, because of the structural characteristics of the Josephson junctions, the carrier density can fluctuate in long range, which can break the long-range order of the superconductors, thus enhancing the dynamic inductance of the superconductors. The first mode can be implemented with simplicity and practicality, and has been verified to be applicable to the preparation of high-performance quantum bits. However, the preparation process of the first mode can be relatively complicated. Also, when the Josephson junctions are connected in series to form an array, they tend to introduce a parasitic resonance modulus, thereby reducing the accuracy and reliability of measurement of superconducting quantum bits.

In a second mode, an inductance component can be prepared by granular aluminum. For example, in "aluminum" of the first type of superconductors, micro-encapsulated non-superconducting aluminium oxide can be introduced. Nano-sized granular aluminum can be separated by aluminium oxide, which is essentially a high-density Josephson junction array. By introducing a non-superconducting phase (e.g., granular aluminum), the charge density can be disordered in a superconducting phase to cause decomposition between a superconductor and a non-superconductor, thereby improving the kinetic inductance of the superconductor. The second mode can provide relatively easy preparation. However, the overall structure prepared by the second mode can be amorphous, and the dielectric loss can be large.

In a third mode, a superconducting nitride of the second type (e.g., niobium nitride, titanium nitride, or niobium titanium nitride) can be set to be a specific structure (e.g., a specific line length or line width), thereby improving the kinetic inductance of the superconductor.

However, the above-described first, second, and third modes can have technical challenges due to their low stability of the preparation process and high requirements for a preparation device.

To solve the technical problems in the existing methods for preparing an inductance element, the present disclosure provides a preparation method and a device for preparing an inductance element, an inductance element, and a superconducting circuit. In accordance with the provided technical solutions, acquiring and then annealing a compound (e.g., a superconductor of a second type) that has a superconducting coherence length shorter than its magnetic field penetration depth can cause spontaneous decomposition between a non-superconductor phase and a superconductor phase included in the compound, thereby generating an inductance element that has kinetic inductance greater than its geometric inductance. By doing so, the preparation difficulty of preparing the inductance element can be effectively lowered, and the accuracy and reliability of measurement of quantum bits can be improved.

Some implementations of the present disclosure are described in detail below with reference to the drawings.

When there is no conflict between the various example embodiments, the features in the example embodiments can be combined with each other.

Figure 2A:
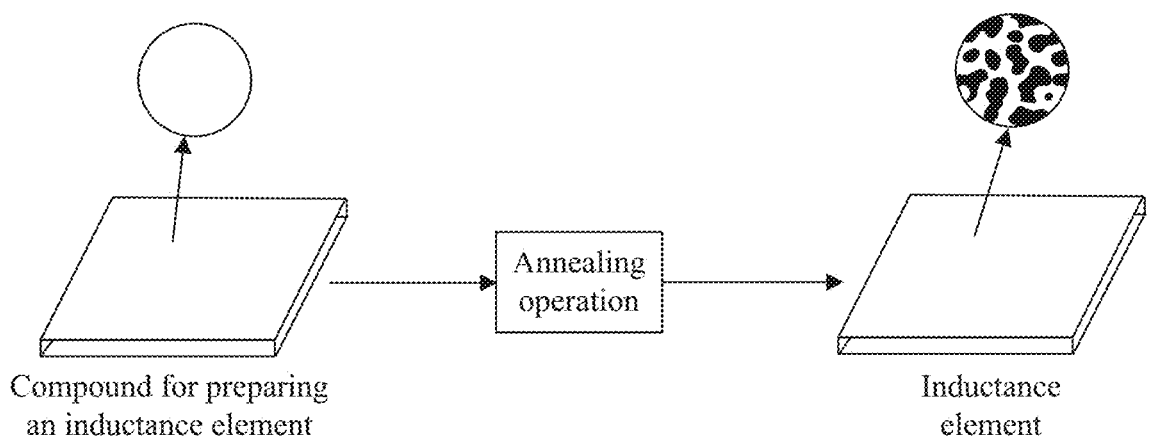
FIG. 2A is a schematic diagram illustrating an example method of preparing an inductance element, consistent with some embodiments of this disclosure.

FIG. 1 is a flowchart of an example method 100 of preparing an inductance element, consistent with some embodiments of this disclosure. FIG. 2A is a schematic diagram illustrating an example method 200A of preparing an inductance element, consistent with some embodiments of this disclosure. Methods 100 and 200A can be performed by a preparation apparatus of an inductance element. It is understandable that the preparation apparatus can be implemented as software or a combination of software and hardware.

Referring to FIG. 1, method 100 can include the following steps. At step S101, a compound for preparing an inductance element can be acquired. A superconducting coherence length and a magnetic field penetration depth of the compound can meet a preset condition. At step S102, the compound can be annealed to cause decomposition between a non-superconductor phase and a superconductor phase included in the compound to generate the inductance element. The kinetic inductance of the inductance element can be greater than the geometric inductance.

In some embodiments, at step S101, the preset condition can be a pre-configured condition for identifying the compound as a superconductor of the second type. For example, the preset condition can include that the superconducting coherence length is shorter than the magnetic field penetration depth. In such a case, when the superconducting coherence length of the compound is shorter than the magnetic field penetration depth, it can be determined that the compound is a superconductor of the second type. It is understandable that the preset condition can also be another condition for identifying the compound as a superconductor of the second type and is not limited to the example embodiments described herein, and those skilled in the art can also set the preset condition arbitrarily in accordance with specific application requirements and design requirements.

In some embodiments, when an inductance element to be prepared has the characteristic that its kinetic inductance is greater than its geometric inductance, and when the compound includes a non-superconductor phase and a superconductor phase, spontaneous decomposition can be caused between the non-superconductor phase and the superconductor phase included in the compound during the annealing process. By doing so, the kinetic inductance of the inductance element can be improved for the preparation of superconducting quantum bits through the inductance element.

In some embodiments, at step S101, the preset condition can be configurable (e.g., configurable by a user). For example, to configure the preset condition, step S101 can further include acquiring an execution operation input by a user for the preset condition, and configuring the preset condition based on the execution operation.

In some embodiments, to acquire the execution operation input by the user, a preparation apparatus can include a signal receiver for receiving the execution operation input by the user. When the user inputs an execution operation for the preset condition through the signal receiver, the preparation apparatus can acquire the execution operation input by the user for the preset condition. It should be noted that the execution operation can be any operation for configuring or adjusting the preset condition. After obtaining the execution operation input by the user for the preset condition, the preset condition can be configured based on the execution operation. By providing such capability, the user can arbitrarily adjust the preset condition based on any application scenario and application requirement, which can further improve the flexibility, reliability, and applicability of the methods provided herein and also ensure the stability and reliability of preparation of the inductance element.

In some embodiments, the compound can be aluminum titanium nitride ($Ti_xAl_{1-x}N$). In such cases, the non-superconductor phase included in the compound can be aluminum nitride, and the superconductor phase can be titanium nitride. It is conceivable that the specific type of the compound is not limited to the aluminum titanium nitride described herein. Those skilled in the art can also set the specific type of the compound in accordance with specific application requirements and design requirements, as long as it can be ensured that the superconducting coherence length of the compound is shorter than the magnetic field penetration depth, and the compound includes a non-superconductor phase and a superconductor phase.

It should be noted that the present disclosure does not limit the modes of acquiring the compound in step S101. Those skilled in the art can set any specific mode of acquiring the compound in accordance with specific application requirements and design requirements.

Figure 3:
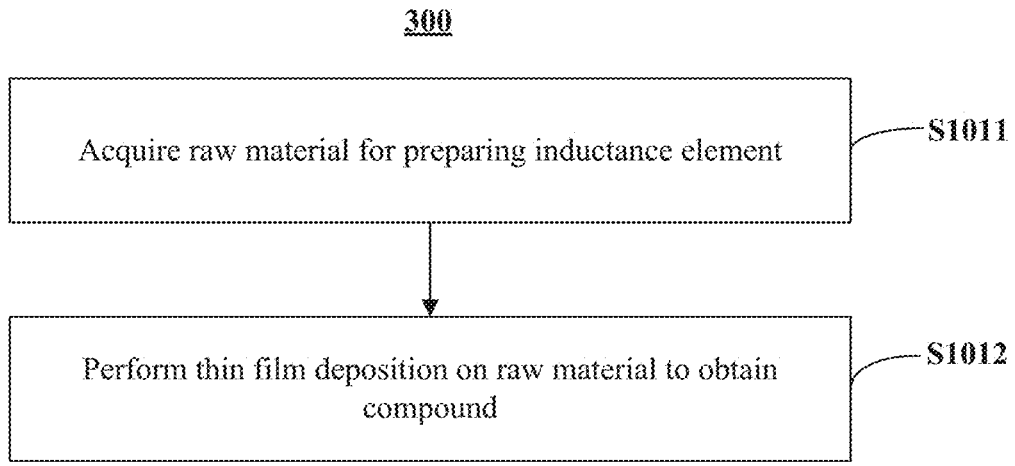
FIG. 3 is a flowchart of an example method of acquiring a compound for preparing an inductance element, consistent with some embodiments of this disclosure.

By way of example, FIG. 3 is a flowchart of an example method 300 of acquiring a compound for preparing an inductance element, consistent with some embodiments of this disclosure. Referring to FIG. 3, at step S1011, a raw material for preparing an inductance element can be acquired. At step S1012, thin film deposition can be performed on the raw material to obtain the compound.

For example, at step S1011, the raw material can be a material with any shape or structure. To improve the preparation quality and efficiency of the inductance element, after acquiring the raw material for preparing the inductance element, at step S1012, the raw material can be subjected to thin film deposition, so that a compound with a thin film structure can be obtained, and then the inductance element can be prepared based on the obtained compound. It should be noted that other modes can be used to acquire the compound for preparing the inductance element, as long as the accuracy and reliability of acquiring the compound can be ensured.

Referring back to FIG. 1, in some embodiments, at step S102, the non-superconductor phase and the superconductor phase can include at least one identical chemical element. For example, the compound can be composed of three chemical elements A, B, and C. The non-superconductor phase in the compound can be composed of A and C, and the superconductor phase can be composed of B and C. In such a case, the non-superconductor phase and the superconductor phase include one identical chemical element "C." In another example, the compound can be composed of four chemical elements A, B, C, and D. The non-superconductor phase in the compound can be composed of A, B, and C, and the superconductor phase can be composed of B, C, and D. In such a case, the non-superconductor phase and the superconductor phase include two identical chemical elements "B" and "C."

In some embodiments, at step S102 of FIG. 1, the non-superconductor phase can be nano-sized. The kinetic inductance of the inductance element can be greater than the geometric inductance. The geometric inductance can be related to a fine structure constant of the inductance element.

In some embodiments, at step S102, to anneal the compound, the compound can be exposed to a high temperature environment for a period of time and then cooled, so that spontaneous decomposition can be caused between the non-superconductor phase and the superconductor phase included in the compound during the annealing process. By doing so, the inductance element can be generated with the kinetic inductance being greater than the geometric inductance.

Figure 2B:
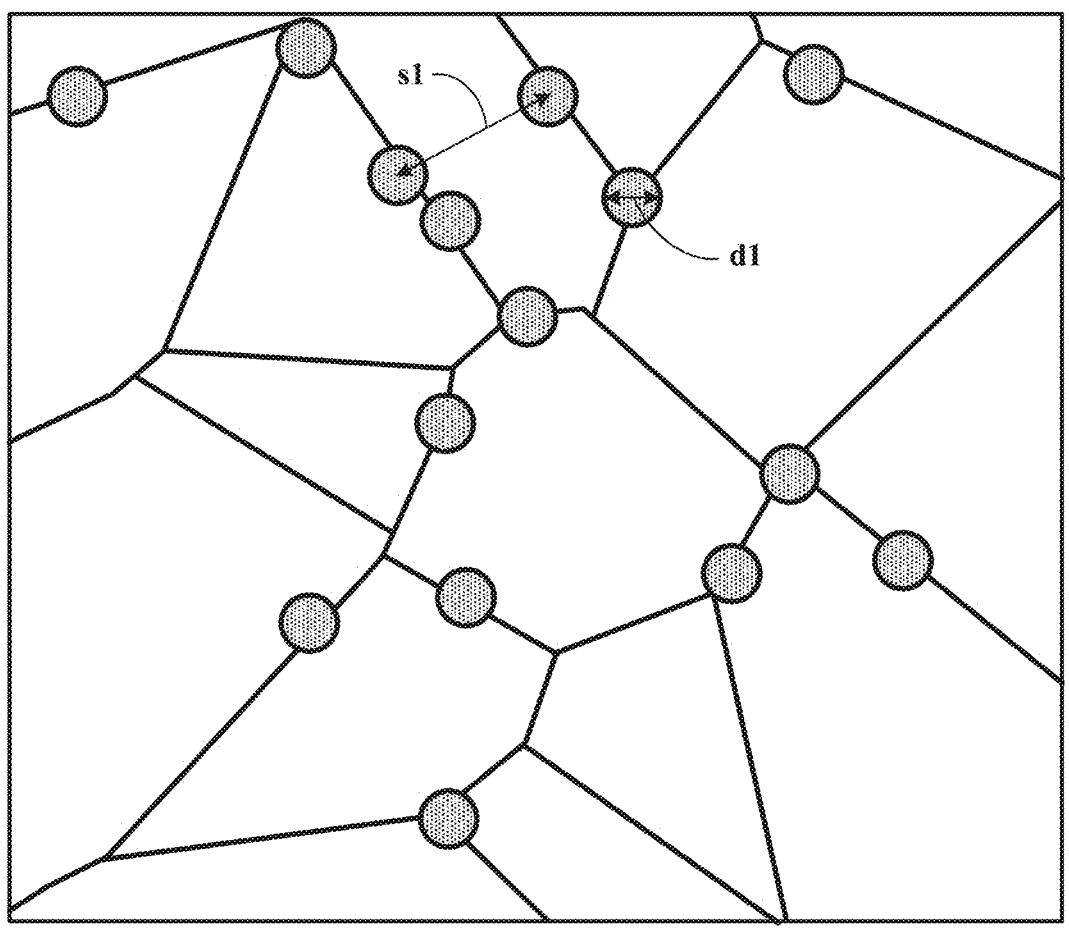
FIG. 2B is a schematic diagram of an example method of preparing an inductance element, consistent with some embodiments of this disclosure.

In some embodiments, at step S102, after acquiring the compound, a phase diagram corresponding to the compound can be obtained. The phase diagram corresponding to the compound can identify the disorder characteristics of material components and the disorder characteristics of chemical components. By way of example, FIG. 2B is a schematic diagram 200B of an example method of preparing an inductance element, consistent with some embodiments of this disclosure. Referring to FIG. 2B, the degree of disorderliness of chemical components identified by diagram 200B corresponding to the compound is relatively low. In such a case, the compound corresponding to diagram 200B can be annealed to improve the kinetic inductance of the inductance element generated using the compound.

Figure 2C:
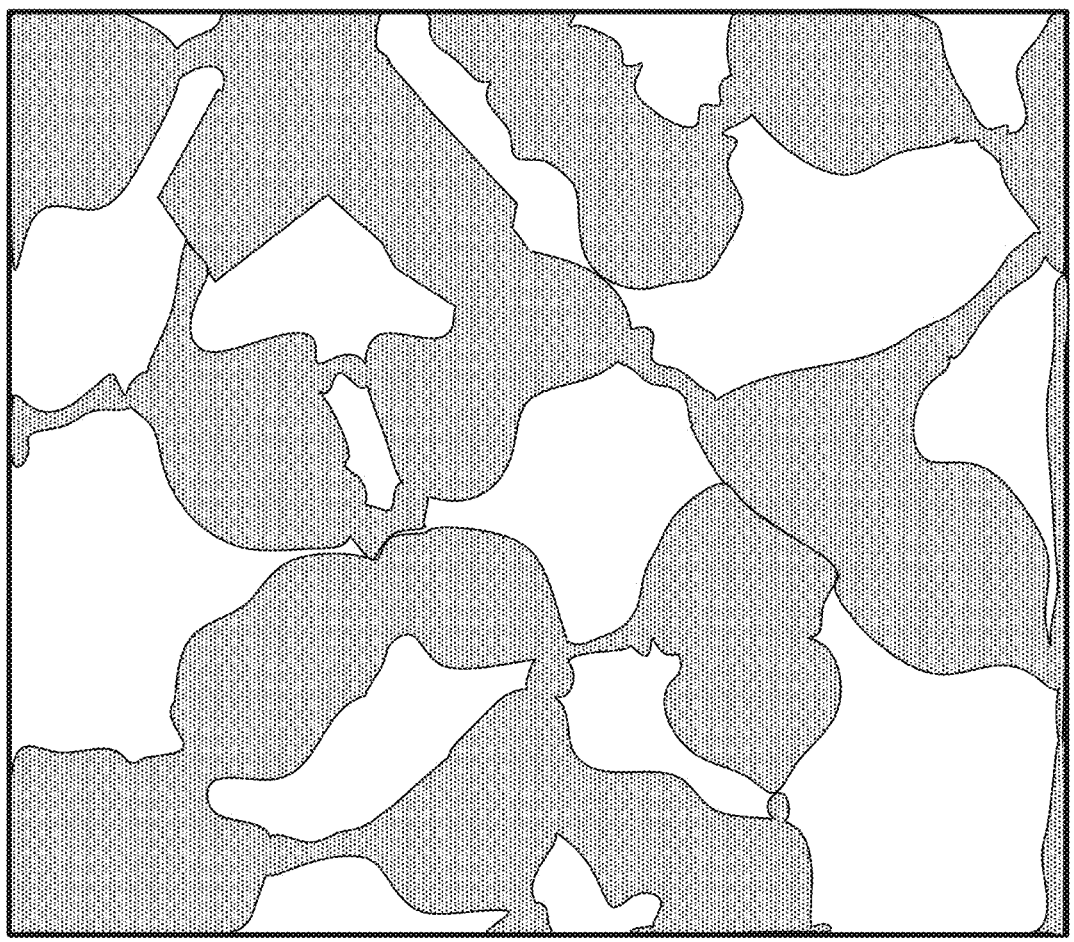
FIG. 2C is another schematic diagram of an example method of preparing an inductance element, consistent with some embodiments of this disclosure.

In some embodiments, at step S102, after the compound being annealed, a phase diagram corresponding to the inductance element generated using the annealed compound can be acquired. The phase diagram corresponding to the inductance element can identify the disorder characteristics of the material components and the disorder characteristics of the chemical components. By way of example, FIG. 2C is another schematic diagram 200C of an example method of preparing an inductance element, consistent with some embodiments of this disclosure. Referring to FIG. 2C, the degree of disorderliness of the chemical components identified by the phase diagram corresponding to the inductance element is relatively high. In such a case, the kinetic inductance of the compound can be effectively improved, in which the kinetic inductance is greater than the geometric inductance in the inductance element.

In some embodiments, at step S102, the compound can be controlled to be annealed based on an annealing control parameter to cause decomposition between the non-superconductor phase and the superconductor phase included in the compound to generate the inductance element. For example, to control the compound to be annealed based on the annealing control parameter, feature information (e.g., at least one of a size feature of the non-superconductor phase, a crystallinity feature of the non-superconductor phase, or a distribution feature of the non-superconductor phase in the compound) of the compound can be controlled based on the annealing control parameter to cause decomposition between the non-superconductor phase and the superconductor phase included in the compound to generate the inductance element. As an example, based on the annealing control parameter, controlling the feature information can include controlling a size feature of the non-superconductor phase in the compound, both the size feature of the non-superconductor phase in the compound and a crystallinity feature of the non-superconductor phase, or all of the size feature of the non-superconductor phase in the compound, the crystallinity feature of the non-superconductor phase, and a distribution feature of the non-superconductor phase. In some embodiments, the annealing control parameter can include at least one of an annealing time or an annealing temperature. In such cases, at least one of the size feature of the non-superconductor phase, the crystallinity feature of the non-superconducting phase, or the distribution feature of the non-superconductor phase in the compound can be controlled based on the annealing time or the annealing temperature.

For example, the annealing control parameter can include an annealing time and an annealing temperature. For the same annealing temperature, when the annealing time is t1 (e.g., corresponding to FIG. 2B), in the compound, the size feature of the non-superconductor phase can be d1 (e.g., d1 shown in FIG. 2B), the crystallinity feature of the non-superconducting phase can be h1, and the distribution feature of the non-superconductor phase can be s1 (e.g., s1 shown in FIG. 2B). When the annealing time is t2 (where t2>t1, such as corresponding to FIG. 2C), in the compound, the size feature of the non-superconductor phase can be d2, the crystallinity feature of the non-superconducting phase can be h2, and the distribution feature of the non-superconductor phase can be s2. The size feature of the non-superconductor phase, the crystallinity feature of the non-superconducting phase, and the distribution feature of the non-superconductor phase in the compound can change in accordance with the annealing time, thereby realizing the decomposition between the non-superconductor phase and the superconductor phase included in the compound. By doing so, an inductance element with its kinetic inductance being greater than its geometric inductance can be generated.

It should be noted that the distribution feature of the non-superconductor phase (e.g., s1 or s2 as described herein) are not limited to be described or illustrated by the example representations in the accompanying drawings (e.g., FIGS. 2B-2C), and a person having ordinary skill in the art can label the distribution feature of the non-superconductor phase in accordance with specific design or application scenarios. It should also be noted that the crystallinity feature (e.g., h1 or h2 as described herein) of the non-superconducting phase is not shown in FIGS. 2B-2C but can be implicitly represented by an X-ray diffraction scanning diagram (e.g., FIG. 10 that will be described herein). For example, the higher a crystallinity feature value of the non-superconducting phase is, the more apparent a peak (e.g., a peak associated with an aluminum titanium nitride material in FIG. 10) that corresponds to the crystallinity feature value can be in the X-ray diffraction scanning diagram. The lower the crystallinity feature value is, the less apparent a peak (e.g., a peak associated with an aluminum titanium nitride material in FIG. 10) that corresponds to the crystallinity feature value can be in the X-ray diffraction scanning diagram.

As another example, the annealing control parameter can include an annealing time and an annealing temperature. For the same annealing time, when the annealing temperature is T1 (e.g., corresponding to FIG. 2B), in the compound, the size feature of the non-superconductor phase can be d3, the crystallinity feature of the non-superconducting phase can be h3, and the distribution feature of the non-superconductor phase can be s3. When the annealing temperature is T2 (where T2>T1, such as corresponding to FIG. 2C), in the compound, the size feature of the non-superconductor phase can be d4, the crystallinity feature of the non-superconducting phase can be h4, and the distribution feature of the non-superconductor phase can be s4. The size feature of the non-superconductor phase, the crystallinity feature of the non-superconducting phase, and the distribution feature of the non-superconductor phase in the compound can change in accordance with the annealing temperature, thereby realizing the decomposition between the non-superconductor phase and the superconductor phase included in the compound. By doing so, an inductance element with its kinetic inductance being greater than its geometric inductance can be generated.

Figure 4:
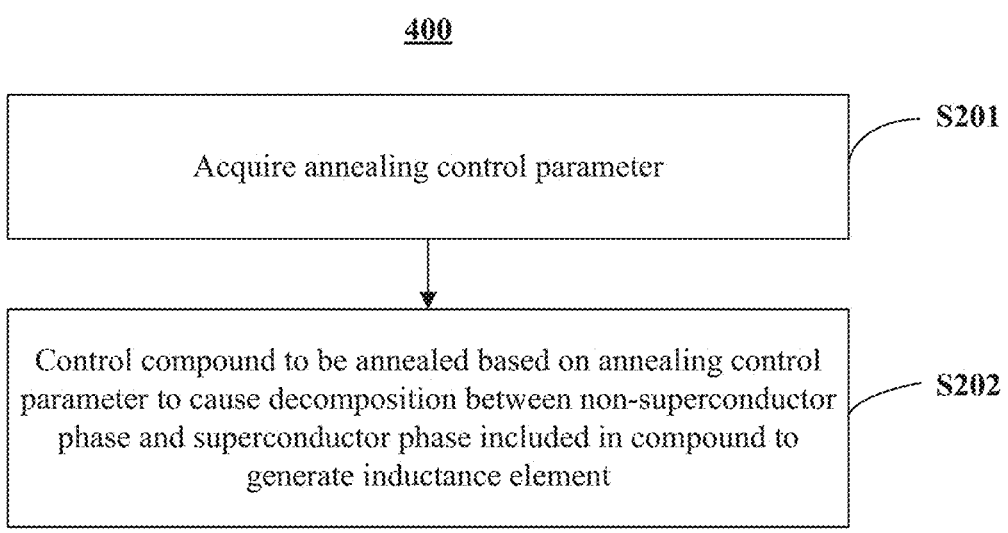
FIG. 4 is a flowchart of an example method of annealing the compound to cause decomposition between a non-superconductor phase and a superconductor phase included in the compound for generating an inductance element, consistent with some embodiments of this disclosure.

By way of example, FIG. 4 is a flowchart of an example method 400 of annealing a compound to cause decomposition between a non-superconductor phase and a superconductor phase included in the compound for generating an inductance element, consistent with some embodiments of this disclosure. For example, all or part of step S102 in method 100 of FIG. 1 can be implemented as method 400. It should be noted that the present disclosure does not limit any specific implementation of annealing the compound besides method 400. Those skilled in the art can adopt any specific implementation in accordance with specific application requirements and design requirements. As shown in FIG. 4, at step S201, an annealing control parameter can be acquired. At step S202, the compound can be controlled to be annealed based on the annealing control parameter to cause decomposition between a non-superconductor phase and a superconductor phase included in the compound to generate the inductance element.

In some embodiments, at step S201, the annealing control parameter can include parameter information for controlling an annealing operation. For example, the annealing control parameter can include at least one of an annealing temperature or an annealing time. That is, the annealing control parameter can include an annealing temperature, an annealing time, or both an annealing temperature and an annealing time. In some embodiments, the annealing temperature can be lower than a melting point temperature of the compound and higher than a preset temperature threshold corresponding to the compound. For example, the preset temperature threshold can be the minimum temperature at which the non-superconductor phase and the superconductor phase in the compound are decomposed. It is understandable that different compounds can correspond to different preset temperature thresholds.

It should be noted that the present disclosure does not limit the implementation of acquiring the annealing control parameter. Those skilled in the art can set any specific implementation in accordance with specific application requirements and design requirements. For example, the annealing control parameter can be stored in a preset area, and the annealing control parameter can be acquired by accessing the preset area. In another example, the annealing control parameter can be stored in a preset apparatus communicatively connected with a preparation apparatus of an inductance element, and then the preparation apparatus can send a parameter acquisition request to the preset apparatus such that the preset apparatus can send the annealing control parameter corresponding to the parameter acquisition request to the preparation apparatus based on the parameter acquisition request, in which the preparation apparatus can obtain the annealing control parameter in a stable manner. It should be noted that other modes can be used to obtain the annealing control parameter, as long as it can be ensured that the annealing control parameter can be obtained stably.

In some embodiments, at step S202, when the annealing control parameter includes an annealing temperature, the compound can be controlled to be annealed based on the annealing temperature. It is understandable that the annealing temperature can refer to a temperature point T or a temperature interval (T1, T2). For example, the annealing temperature T can be pre-configured, and then the compound can be controlled to be annealed based on the annealing temperature T. By way of example, the compound can be exposed to the annealing temperature T for a period of time and then slowly cooled such that spontaneous decomposition can be caused between the non-superconductor phase and the superconductor phase included in the compound during the annealing process, thereby generating an inductance element with its kinetic inductance being greater than its geometric inductance. In another example, an annealing time interval (T1, T2) can be pre-configured, and then the compound can be controlled to be annealed based on the annealing time interval (T1, T2). By way of example, the compound can be exposed to an annealing temperature Tx for a period of time and then slowly cooled. The annealing temperature Tx can be any temperature point in the annealing time interval (T1, T2). By doing so, spontaneous decomposition can be caused between the non-superconductor phase and the superconductor phase included in the compound during the annealing process, thereby generating an inductance element with its kinetic inductance being greater than its geometric inductance.

In some embodiments, the degree of decomposition between the non-superconductor phase and the superconductor phase can be directly proportional to the annealing temperature. For example, an annealing temperature Ta1 and an annealing temperature Ta2 can be pre-configured, in which the annealing temperature Ta1 is higher than the annealing temperature Ta2. Then, when the compound is controlled to be annealed based on the annealing temperature Ta1, spontaneous decomposition can be caused between the non-superconductor phase and the superconductor phase included in the compound during the annealing operation, thereby generating a first inductance element with its kinetic inductance being greater than its geometric inductance. In such cases, the degree of spontaneous decomposition between the non-superconductor phase and the superconductor phase in the first inductance element can be represented as D1. When the compound is controlled to be annealed based on the annealing temperature Ta2, spontaneous decomposition can be caused between the non-superconductor phase and the superconductor phase included in the compound during the annealing operation, thereby generating a second inductance element with its kinetic inductance being greater than its geometric inductance. In such cases, the degree of spontaneous decomposition between the non-superconductor phase and the superconductor phase in the second inductance element can be represented as D2. If the degree of decomposition between the non-superconductor phase and the superconductor phase is directly proportional to the annealing temperature, and if the annealing temperature Ta1 is higher than the annealing temperature Ta2, after obtaining the degrees of spontaneous decomposition D1 and D2 between the non-superconductor phase and the superconductor phase, it can be determined that D1>D2.

In some embodiments, at step S202, when the annealing control parameter includes an annealing time, the compound can be controlled to be annealed based on the annealing time. It is understandable that the annealing time can be a time point t or a time interval (t1, t2). For example, the annealing time t can be pre-configured, and then the compound can be controlled to be annealed based on annealing time t. By way of example, the compound can be exposed to a preset high temperature for a period of time t and then slowly cooled such that spontaneous decomposition can be caused between the non-superconductor phase and the superconductor phase included in the compound during the annealing process, thereby generating an inductance element with its kinetic inductance being greater than its geometric inductance. In another example, a time interval (t1, t2) can be pre-configured, and then the compound can be controlled to be annealed based on the time interval (t1, t2). By way of example, the compound can be exposed to a high temperature for a period of time ty and then slowly cooled. The time ty can be any time point in the time interval (t1, t2). By doing so, spontaneous decomposition can be caused between the non-superconductor phase and the superconductor phase included in the compound during the annealing process, thereby generating an inductance element with its kinetic inductance being greater than its geometric inductance.

In some embodiments, the degree of decomposition between the non-superconductor phase and the superconductor phase can be directly proportional to the annealing time. For example, an annealing time ty1 and an annealing time ty2 can be pre-configured, in which the annealing time ty1 is longer than the annealing time ty2. Then, when the compound is controlled to be annealed based on annealing time ty1, spontaneous decomposition can be caused between the non-superconductor phase and the superconductor phase included in the compound during the annealing operation, thereby generating a third inductance element with its kinetic inductance being greater than its geometric inductance. In such cases, the degree of spontaneous decomposition between the non-superconductor phase and the superconductor phase in the third inductance element can be represented as Dt1. When the compound is controlled to be annealed based on the annealing time ty2, spontaneous decomposition can be caused between the non-superconductor phase and the superconductor phase included in the compound during the annealing operation, thereby generating a fourth inductance element with its kinetic inductance being greater than its geometric inductance. In such cases, the degree of spontaneous decomposition between the non-superconductor phase and the superconductor phase in the fourth inductance element can be represented as Dt2. If the degree of decomposition between the non-superconductor phase and the superconductor phase is directly proportional to the annealing time, and if the annealing time ty1 is longer than the annealing time ty2, after obtaining the degrees of spontaneous decomposition Dt1 and Dt2 between the non-superconductor phase and the superconductor phase, it can be determined that Dt1>Dt2.

In some embodiments, the degree of decomposition between the non-superconductor phase and the superconductor phase can be inversely proportional to the annealing time. For example, an annealing time ty1 and an annealing time ty2 can be pre-configured, in which the annealing time ty1 is longer than the annealing time ty2. Then, when the compound is controlled to be annealed based on the annealing time ty1, spontaneous decomposition can be caused between the non-superconductor phase and the superconductor phase included in the compound during the annealing operation, thereby generating a fifth inductance element with its kinetic inductance being greater than its geometric inductance. In such cases, the degree of spontaneous decomposition between the non-superconductor phase and the superconductor phase in the fifth inductance element can be represented as Dt1. When the compound is controlled to be annealed based on the annealing time ty2, spontaneous decomposition can be caused between the non-superconductor phase and the superconductor phase included in the compound during the annealing operation, thereby generating a sixth inductance element with its kinetic inductance being greater than its geometric inductance. In such cases, the degree of spontaneous decomposition between the non-superconductor phase and the superconductor phase in the sixth inductance element can be represented as Dt2. If the degree of decomposition between the non-superconductor phase and the superconductor phase is inversely proportional to the annealing time, and if the annealing time ty1 is greater than the annealing time ty2, after obtaining the degrees of spontaneous decomposition Dt1 and Dt2 between the non-superconductor phase and the superconductor phase, it can be determined that Dt1<Dt2.

In some embodiments, at step S202, when the annealing control parameter includes an annealing temperature and an annealing time, the compound can be controlled to be annealed based on the annealing temperature and the annealing time. It is understandable that the annealing temperature can be a temperature point or a temperature interval, and the annealing time can be a time point or a time interval. For example, an annealing temperature T and an annealing time t can be pre-configured, and then the compound can be controlled to be annealed based on the annealing temperature T and the annealing time t. By way of example, the compound can be exposed to the annealing temperature T for the period of time t and then slowly cooled such that spontaneous decomposition can be caused between the non-superconductor phase and the superconductor phase included in the compound during the annealing process, thereby generating an inductance element with its kinetic inductance being greater than its geometric inductance. In another example, an annealing time interval (T1, T2) and a time interval (t1, t2) can be pre-configured, and then the compound can be controlled to be annealed based on the annealing time interval (T1, T2) and the time interval (t1, t2). By way of example, the compound can be exposed to an annealing temperature Ta for a period of time tb and then slowly cooled. The annealing temperature Ta can be any temperature point in the annealing time interval (T1, T2), and the time tb can be any time point in the time interval (t1, t2). By doing so, spontaneous decomposition can be caused between the non-superconductor phase and the superconductor phase included in the compound during the annealing process, thereby generating an inductance element with its kinetic inductance being greater than its geometric inductance.

In some embodiments, when the annealing control parameter includes an annealing temperature and an annealing time, if the degree of decomposition between the non-superconductor phase and the superconductor phase is directly proportional to the annealing temperature and also directly proportional to the annealing time, it can be determined that the degree of decomposition between the non-superconductor phase and the superconductor phase is directly proportional to the annealing control parameter. For example, at the same annealing temperature, the larger the annealing time is, the greater the degree of decomposition between the non-superconductor phase and the superconductor phase can be. In another example, at the same annealing time, the higher the annealing temperature is, the greater the degree of decomposition between the non-superconductor phase and the superconductor phase can be.

In some embodiments, when the annealing control parameter includes an annealing temperature and an annealing time, if the degree of decomposition between the non-superconductor phase and the superconductor phase is directly proportional to the annealing temperature and inversely proportional to the annealing time, a relationship between the degree of decomposition between the non-superconductor phase and the superconductor phase and the annealing control parameter can have the following two situations.

In a first situation, the degree of decomposition between the non-superconductor phase and the superconductor phase can be directly proportional to the annealing control parameter. In such cases, a control degree level corresponding to the annealing control parameter can be determined based on the annealing temperature and the annealing time. For example, a mapping relationship between the annealing temperature, the annealing time, and the control degree level can be pre-configured. After the control degree level is obtained, the compound can be controlled to be annealed based on the control degree level to generate an inductance element. It should be noted that the greater the control degree level is, the greater the degree of decomposition between the non-superconductor phase and the superconductor phase can be.

In a second situation, the degree of decomposition between the non-superconductor phase and the superconductor phase can be inversely proportional to the annealing control parameter. In such cases, a control degree level corresponding to the annealing control parameter can be determined based on the annealing temperature and the annealing time. For example, a mapping relationship between the annealing temperature, the annealing time, and the control degree level can be pre-configured. After the control degree level is obtained, the compound can be controlled to be annealed based on the control degree level to generate an inductance element. It should be noted that the greater the control degree level is, the smaller the degree of decomposition between the non-superconductor phase and the superconductor phase can be.

As illustrated and described in association with FIG. 4, by acquiring an annealing control parameter and then controlling the compound to be annealed based on the annealing control parameter, decomposition between the non-superconductor phase and the superconductor phase included in the compound can be effectively realized during the process of controlling the compound to be annealed. By doing so, it is possible to generate an inductance element with a relatively large kinetic inductance, which can effectively reduce the preparation difficulty of preparing the inductance element, and can further improve the accuracy and reliability of measurement of quantum bits.

Figure 5:
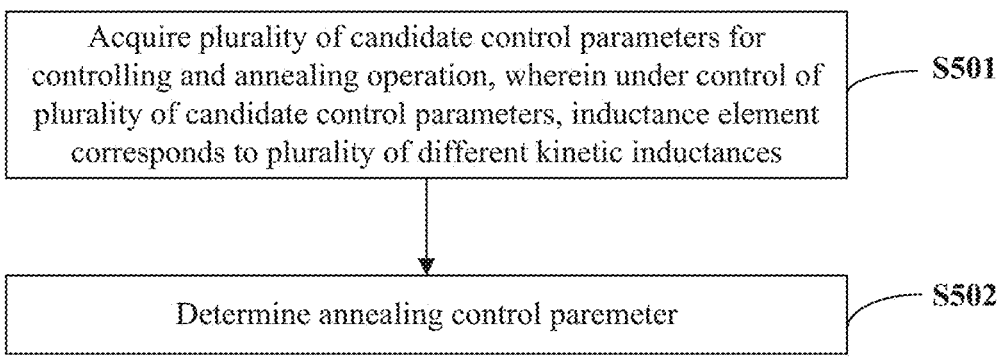
FIG. 5 is a flowchart of an example method of acquiring an annealing control parameter, consistent with some embodiments of this disclosure.

By way of example, FIG. 5 is a flowchart of an example method 500 of acquiring an annealing control parameter, consistent with some embodiments of this disclosure. For example, all or part of step S201 in method 400 of FIG. 4 can be implemented as method 500. It should be noted that the present disclosure does not limit the implementation of acquiring the annealing control parameter. Those skilled in the art can set any specific implementation in accordance with specific application requirements and design requirements. As shown in FIG. 5, at step S501, a plurality of candidate control parameters for controlling an annealing operation can be acquired. Under the control of the plurality of candidate control parameters, the inductance element can correspond to a plurality of different kinetic inductances. At step S502, the annealing control parameter can be determined among the plurality of candidate control parameters to maximize the kinetic inductance of the inductance element.

In some embodiments, at step S501, the plurality of candidate control parameters can be pre-configured and used to control the annealing operation of the compound. It is understandable that the plurality of annealing control parameters can be different annealing control parameters corresponding to a plurality of different application scenarios or application requirements. It should be noted that the present disclosure does not limit the implementation of acquiring the plurality of candidate control parameters for controlling an annealing operation. Those skilled in the art can set any specific implementation in accordance with specific application requirements and design requirements. For example, the plurality of candidate control parameters can be stored in a preset area, and the annealing control parameter can be acquired by accessing the preset area. In another example, the plurality of candidate control parameters can be stored in a preset apparatus communicatively connected with a preparation apparatus of an inductance element, and then the preparation apparatus can send a parameter acquisition request to the preset apparatus such that the preset apparatus can send the plurality of candidate control parameters corresponding to the parameter acquisition request to the preparation apparatus based on the parameter acquisition request, by which the preparation apparatus can obtain the plurality of candidate control parameters in a stable manner. It should be noted that other modes can also be used to obtain the plurality of candidate control parameters, as long as it can be ensured that the plurality of candidate control parameters can be obtained stably.

In some embodiments, referring back to FIG. 5, at step S502, an annealing control parameter can be selected from the plurality of candidate control parameters. The number of the selected annealing control parameters can be one or more, and the selected annealing control parameters can be used as one or more target control parameters for annealing the compound to maximize the kinetic inductance of the inductance element.

Figure 6:
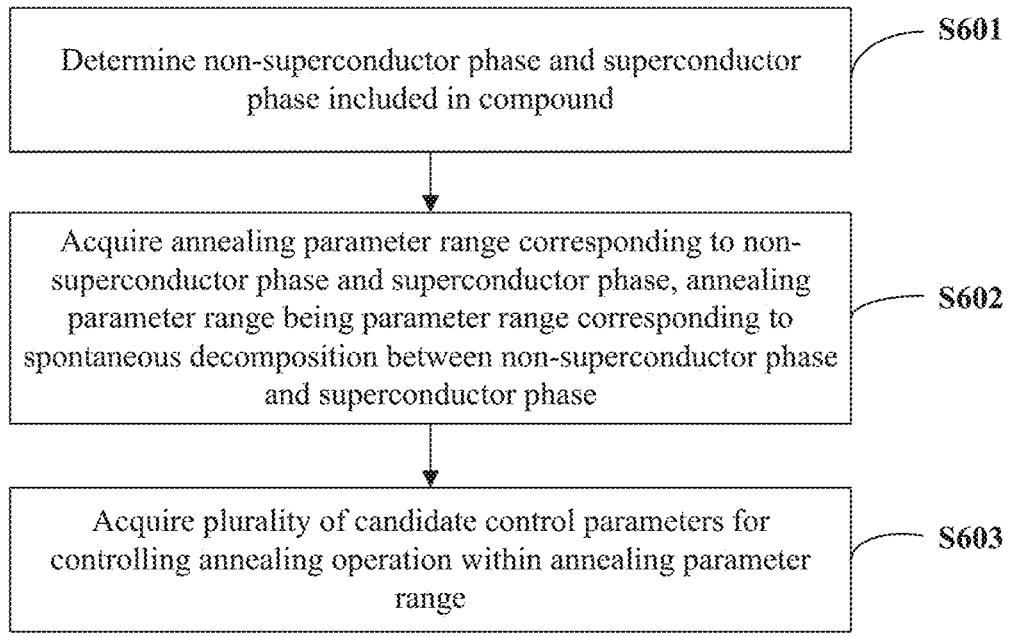
FIG. 6 is a flowchart of an example method of acquiring a plurality of candidate control parameters for controlling an annealing operation, consistent with some embodiments of this disclosure.

By way of example, FIG. 6 is a flowchart of an example method 600 of acquiring a plurality of candidate control parameters for controlling an annealing operation, consistent with some embodiments of this disclosure. For example, all or part of step S501 in method 500 of FIG. 5 can be implemented as method 600. As shown in FIG. 6, at step S601, a non-superconductor phase and a superconductor phase included in the compound can be determined. At step S602, an annealing parameter range corresponding to the non-superconductor phase and the superconductor phase can be acquired. The annealing parameter range can be a parameter range corresponding to spontaneous decomposition between the non-superconductor phase and the superconductor phase. At step S603, the plurality of candidate control parameters for controlling the annealing operation can be acquired within the annealing parameter range.

Figure 7:
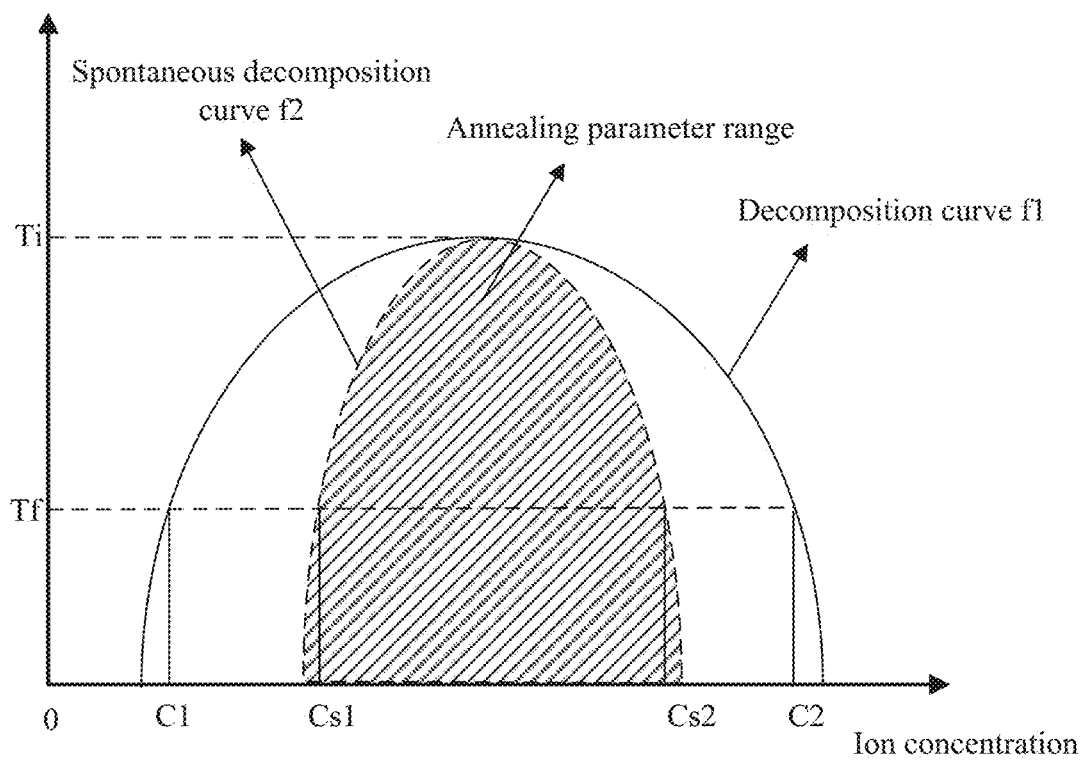
FIG. 7 is a schematic diagram illustrating example Gibbs free energy curves at different temperatures, consistent with some embodiments of this disclosure.

In some embodiments, at step S601, after the compound is controlled to be annealed, the non-superconductor phase and the superconductor phase included in the compound can be identified. After the non-superconductor phase and the superconductor phase included in the compound are identified, at step S602, an annealing parameter range corresponding to the non-superconductor phase and the superconductor phase can be acquired. The annealing parameter range can be a parameter range corresponding to the spontaneous decomposition between the non-superconductor phase and the superconductor phase. It is understandable that the annealing parameter range can include at least one of an annealing temperature or an annealing time. By way of example, FIG. 7 is a schematic diagram illustrating example Gibbs free energy curves at different temperatures, consistent with some embodiments of this disclosure. With reference to FIGS. 6-7, for example, the annealing parameter range (represented as a shaded area in FIG. 7) can include several annealing temperatures, several annealing times, or several annealing temperatures and several annealing times.

It should be noted that the present disclosure does not limit the mode of acquiring the annealing parameter range corresponding to the non-superconductor phase and the superconductor phase. Those skilled in the art can set any mode in accordance with specific application requirements and design requirements. For example, after the non-superconductor phase and the superconductor phase are determined, a mapping relationship between the non-superconductor phase, the superconductor phase, and the annealing parameter range can be pre-configured, and the annealing parameter range corresponding to the non-superconductor phase and the superconductor phase can be determined through the mapping relationship. In another example, after the non-superconductor phase and the superconductor phase are determined, the non-superconductor phase and the superconductor phase can be analyzed and processed to obtain the annealing parameter range corresponding to the non-superconductor phase and the superconductor phase.

Figure 8:
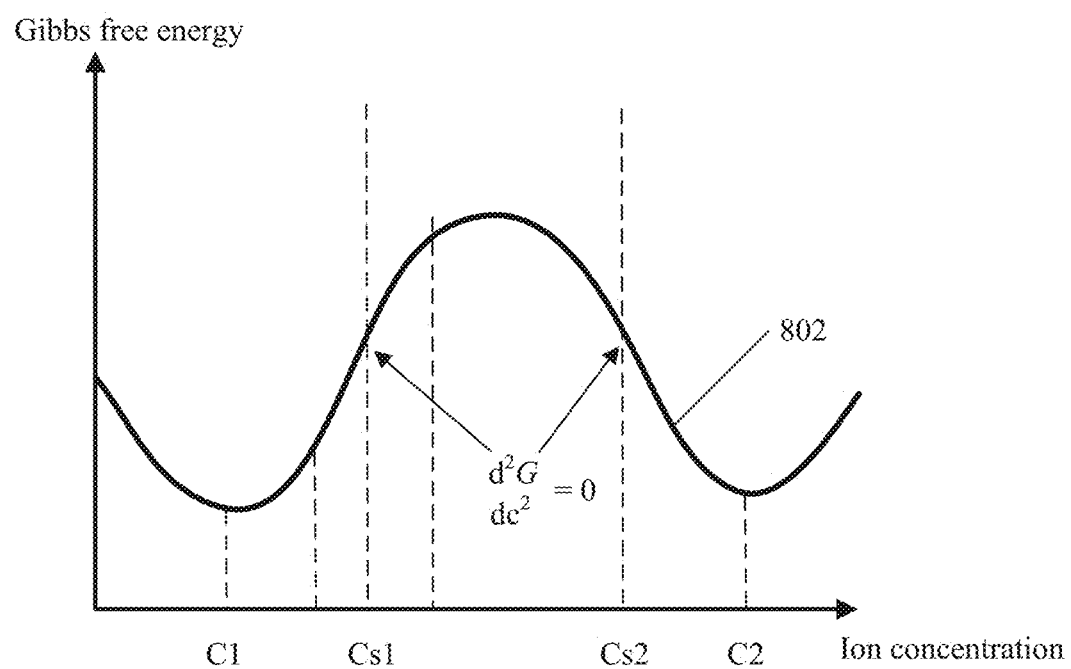
FIG. 8 is a schematic diagram illustrating example Gibbs free energy curves at a preset temperature, consistent with some embodiments of this disclosure.

By way of example, FIG. 8 is a schematic diagram illustrating example Gibbs free energy curves at a preset temperature, consistent with some embodiments of this disclosure. In FIG. 8, a Gibbs free energy variation curve 802 at preset temperature t is illustrated. Based on Gibbs free energy variation curve 802, first concentration information Cs1 and second concentration information Cs2 with a Gibbs free energy gradient change of zero ($d^2G/dc^2=0$) can then be obtained, and third concentration information C1 (e.g., a first local minimum value) and fourth concentration information C2 (e.g., a second local minimum value) corresponding to Gibbs free energy variation curve 802 can be determined. Similarly, first concentration information Cs1, second concentration information Cs2, third concentration information C1, and fourth concentration information C2 corresponding to Gibbs free energy variation curve 802 at different preset temperatures can be counted, so that a schematic diagram (e.g., the schematic diagram shown in FIG. 7) of Gibbs free energy curve at different temperatures can be obtained.

Referring back to FIG. 6, at step S603, after the annealing parameter range is obtained, a plurality of candidate control parameters for controlling an annealing operation can be acquired within the annealing parameter range. For example, with reference to FIG. 7 that shows a decomposition curve f1 and a spontaneous decomposition curve f2, a range covered by decomposition curve f1 can be referred to as S1, and a range covered by spontaneous decomposition curve f2 can be referred to as S2, in which S1 is greater than S2 (e.g., S1 includes S2). Range S1 can be the annealing parameter range where decomposition of the compound can be caused, and range S2 can be the annealing parameter range where spontaneous decomposition of the compound can be caused.

For example, with reference to FIG. 7, when the annealing control parameter includes parameters located in range S2, the spontaneous decomposition between the non-superconductor phase and the superconductor phase included in the compound can be caused. When the annealing control parameter includes parameters located in range S1, the decomposition between the non-superconductor phase and the superconductor phase included in the compound can be caused. When the annealing control parameter is in range S1 but not in range S2, the decomposition between the non-superconductor phase and the superconductor phase included in the compound can be caused when triggered by an external force. When the annealing control parameter is outside range S1, the decomposition between the non-superconductor phase and the superconductor phase included in the compound is not caused.

Referring back to FIG. 6, to ensure that the spontaneous decomposition is caused in the compound during the annealing operation, at step S602, range S2 covered by spontaneous decomposition curve f2 can be determined as the annealing parameter range. After the annealing parameter range is obtained, at step S603, a plurality of candidate control parameters for controlling an annealing operation can be acquired within the annealing parameter range. By doing so, the stability and reliability of acquiring the plurality of candidate control parameters for controlling the annealing operation can be effectively ensured. Moreover, the spontaneous decomposition can be caused in the compound when annealing the compound using the selected plurality of candidate control parameters to generate an inductance element with its kinetic inductance being greater than its geometric inductance.

Figure 9:
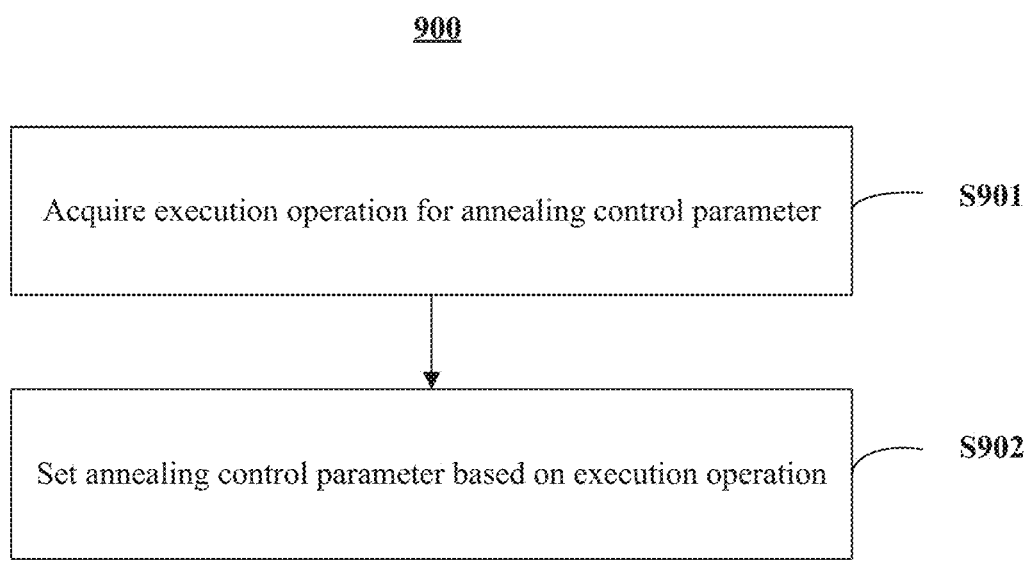
FIG. 9 is a flowchart of another example method of configuring an annealing control parameter, consistent with some embodiments of this disclosure.

By way of example, FIG. 9 is a flowchart of an example method 900 of configuring an annealing control parameter, consistent with some embodiments of this disclosure. For example, the annealing control parameter of step S502 in method 500 of FIG. 5 can be configured by performing method 900. It should be noted that the annealing control parameter can be set (e.g., by a user) based on different application scenarios and application requirements. As shown in FIG. 9, at step S901, an execution operation (e.g., input by a user) for the annealing control parameter can be acquired. At step S902, the annealing control parameter can be set based on the execution operation.

In some embodiments, at step S901, a preparation apparatus can include a signal receiver for acquiring the execution operation. For example, when a user inputs the execution operation for the annealing control parameter (e.g., including at least one of an annealing temperature or an annealing time) through the signal receiver, the preparation apparatus can acquire the execution operation input by the user for the annealing control parameter. The execution operation can be any operation for setting the annealing control parameter. After acquiring the execution operation, the annealing control parameter can be set based on the execution operation. The compound can be annealed based on the annealing control parameter to cause the decomposition between the non-superconductor phase and the superconductor phase included in the compound to generate the inductance element. By doing so, the kinetic inductance of the inductance element can be greater than the geometric inductance, thereby effectively ensuring the quality and efficiency of generation of the inductance element and also improving the flexibility and reliability of method 900.

Consistent with some embodiments of this disclosure, an aluminum titanium nitride can be described as an example embodiment of the preparation of the inductance element. The aluminum titanium nitride can realize an unsteady spontaneous decomposition through an annealing operation to form a nano-structured inductance element, which can have high kinetic inductance. The example embodiment of preparing the inductance element using the aluminum titanium nitride is described as follows.

First, an aluminum titanium nitride material can be generated. For example, a titanium aluminum alloy material can be acquired, and then the titanium aluminum alloy material can be subjected to a nitrogen-filled magnetron sputtering operation to generate an aluminum titanium nitride material (e.g., $Ti_xAl_{(1-x)}N$, such as $Ti_{0.5}Al_{0.5}N$). The aluminum titanium nitride material can be subjected to thin film deposition to obtain an aluminum titanium nitride thin film that is determined as the aluminum titanium nitride material. It is understandable that aluminum titanium nitride material $Ti_xAl_{(1-x)}N$ in this disclosure is not limited to the $Ti_{0.5}Al_{0.5}N$ as described herein, and those skilled in the art can arbitrarily set x and 1−x in accordance with specific application scenarios and application requirements.

After generating the aluminum titanium nitride material, an annealing temperature and an annealing time for annealing the aluminum titanium nitride material can be acquired.

For example, the degree of decomposition between the non-superconductor phase and the superconductor phase in the aluminum titanium nitride material during the annealing operation can be directly proportional to the annealing temperature. By way of example, the higher the annealing temperature is, the greater the degree of decomposition between the non-superconductor phase and the superconductor phase can be.

After acquiring the annealing temperature and the annealing time, the aluminum titanium nitride material can be annealed based on the annealing temperature and the annealing time to cause decomposition between the non-superconductor phase and the superconductor phase included in the compound to generate an inductance element. For example, after acquiring annealing conditions (e.g., including the annealing temperature and the annealing time) are obtained, $Ti_xAl_{(1-x)}N$ can be annealed based on the annealing conditions to cause spinodal decomposition between the non-superconductor phase and the superconductor phase in the aluminum titanium nitride material. In such cases, by appropriately adjusting the annealing conditions, the size, crystallinity, and distribution information of the non-superconductor AlN phase can be controlled to maximize kinetic inductance of the inductance element and minimize its signal loss.

In some embodiments, during the process of annealing the aluminum titanium nitride material, the aluminum titanium nitride material can automatically undergo spontaneous decomposition during the cooling process. For example, the nano-sized non-superconducting AlN phase can be condensed in a superconducting TiN phase. With the degree of variation of the chemical disorder, structural disorder, and charge disorder ("disorderliness") between the non-superconductor phase and the superconductor phase, the inductance element can exhibit relatively high kinetic inductance.

Figure 10:
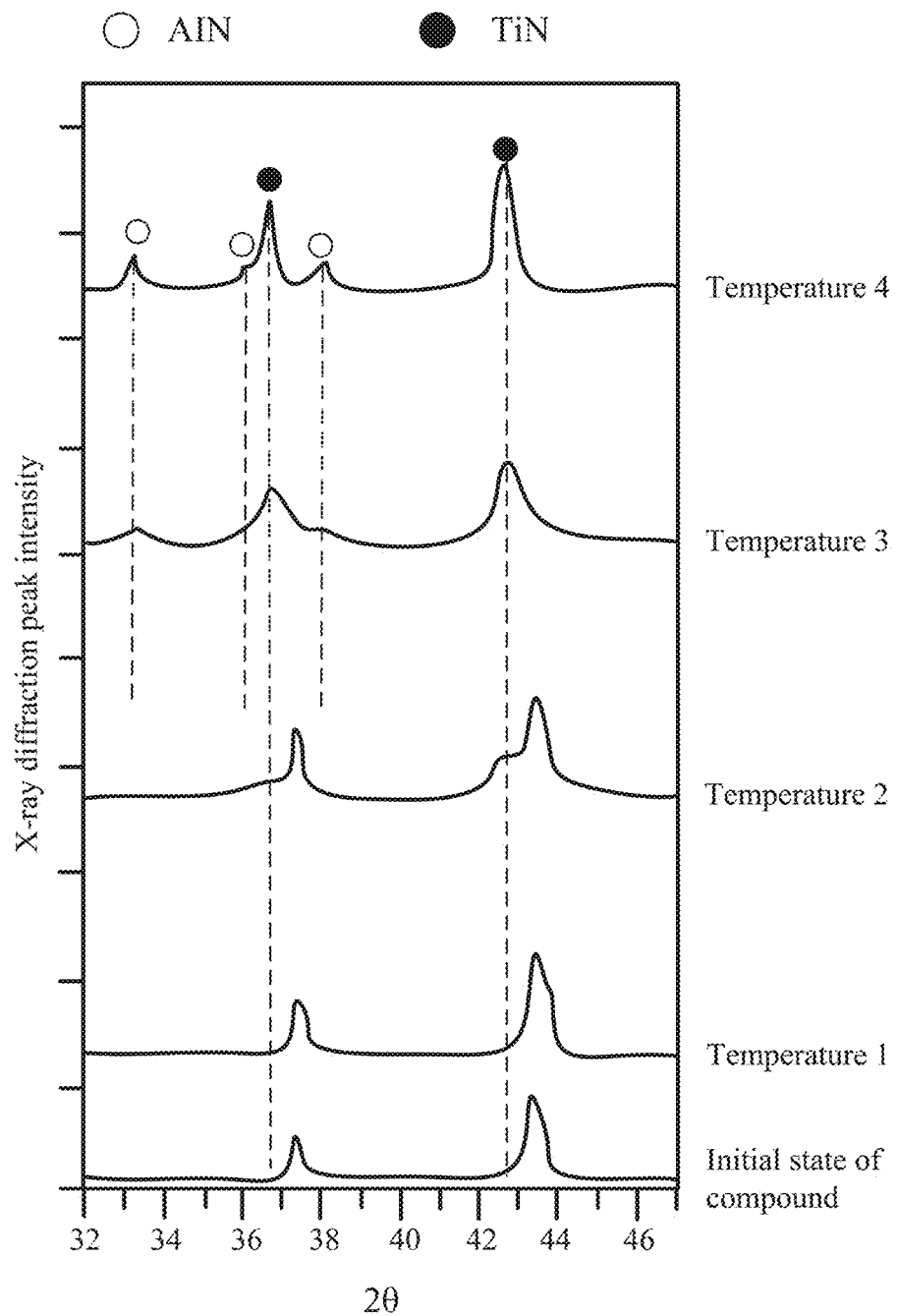
FIG. 10 is a schematic diagram illustrating example decomposition between a non-superconductor phase and a superconductor phase included in a compound, consistent with some embodiments of this disclosure.

By way of example, FIG. 10 is a schematic diagram illustrating example decomposition between a non-superconductor phase and a superconductor phase included in a compound, consistent with some embodiments of this disclosure. Taking $Ti_{0.5}Al_{0.5}N$ as an example aluminum titanium nitride material, as shown in FIG. 10, when compound $Ti_{0.5}Al_{0.5}N$ is in an initial state of synthesis, decomposition between the non-superconductor phase and the superconductor phase in the compound is not caused, as illustrated by a curve associated with a label "initial state of compound" in FIG. 10. By annealing the aluminum titanium nitride material $Ti_{0.5}Al_{0.5}N$, as the annealing temperature increases, the decomposition between the non-superconductor phase and the superconductor phase in the compound can be caused, as illustrated by curves respectively associated with labels "Temperature 1," "Temperature 2," "Temperature 3," and "Temperature 4" in FIG. 10.

In some embodiments, to measure the decomposition between the non-superconductor phase and the superconductor phase in the compound in time, an X-ray diffraction technique can be used to scan the aluminum titanium nitride material during the annealing operation at different angles. After deposition, clear decomposition can exist in all compounds, and different annealing temperatures and annealing times can cause the compounds to generate additional phases or micro-structures (e.g., non-superconductor phase aluminum nitride AlN and superconductor phase titanium nitride TiN), by which a schematic micro-structure diagram corresponding to the compound can be obtained.

For example, at temperature 1 of FIG. 10, based on the schematic micro-structure diagram corresponding to the compound at temperature 1, it can be determined that the degree of decomposition between the non-superconductor phase and the superconductor phase in the compound is d1. For example, the degree of decomposition d1 can represent that there is no non-superconductor phase and superconductor phase in the compound.

At temperature 2 (being higher than temperature 1) of FIG. 10, based on the schematic micro-structure diagram corresponding to the compound at temperature 2, it can be determined that the degree of decomposition between the non-superconductor phase and the superconductor phase in the compound is d2 (where d2>d1). As shown in FIG. 10, the curve corresponding to "Temperature 2" shows ion concentration in which the non-superconductor phase "aluminum nitride" (labeled as a legend "AlN" in FIG. 10) and the superconductor phase "titanium nitride" (labeled as a legend "TiN" in FIG. 10) gradually appear in the compound.

At temperature 3 (being higher than temperature 2) of FIG. 10, based on the schematic micro-structure diagram corresponding to the compound at temperature 3, it can be determined that the degree of decomposition between the non-superconductor phase and the superconductor phase in the compound is d3 (where d3>d2). As shown in FIG. 10, the curve corresponding to "Temperature 3" shows ion concentration in which the non-superconductor phase "aluminum nitride" ("AlN") and the superconductor phase "titanium nitride" ("TiN") continuously appear in the compound.

At temperature 4 (being higher than temperature 3) of FIG. 10, based on the schematic micro-structure diagram corresponding to the compound at temperature 4, it can be determined that the degree of decomposition between the non-superconductor phase and the superconductor phase in the compound is d4 (where d4>d3). As shown in FIG. 10, the curve corresponding to "Temperature 4" shows ion concentration in which the non-superconductor "aluminum nitride" ("AlN") and the superconductor phase "titanium nitride" ("TiN") obviously appear in the compound. At temperature 4, the decomposition between the non-superconductor phase and the superconductor phase included in the compound is caused, thereby generating an inductance element with its kinetic inductance being greater than its geometric inductance.

It should be noted that the surface kinetic inductance of the inductance element (e.g., being of a superconducting material) can be calculated from a formula $L_s = \hbar \rho_N / \pi \Delta t$, where $L_s$ represents the surface kinetic inductance, $\rho_N$ represents a non-superconducting resistivity, $\Delta$ represents a superconducting energy band gap, $\hbar$ represents a reduced Planck constant, and t represents the thickness of the inductance element. From such a formula, it can be seen that the surface kinetic inductance of the inductance element is directly proportional to the non-superconducting resistivity and inversely proportional to the superconducting energy band gap. In such a case, the annealing operation on the aluminum titanium nitride material can cause the decomposition between the non-superconductor phase and the superconductor phase in the aluminum titanium nitride material, which can effectively increase the non-superconducting resistivity of the inductance element, reduce the superconducting energy band gap of the inductance element, and improve the kinetic inductance corresponding to the inductance element.

After annealing the aluminum titanium nitride material based on the annealing temperature and the annealing time to cause decomposition between the non-superconductor phase and the superconductor phase included in the compound to generate an inductance element, a kinetic inductance corresponding to the inductance element can be detected. In some embodiments, the inductance element can be detected by a microwave resonator. For example, the kinetic inductance of the inductance element can be determined through a microwave signal emitted by the microwave resonator. By doing so, a user can be enabled to prepare a corresponding superconducting circuit based on the kinetic inductance corresponding to the inductance element, thereby improving the accuracy and reliability of measurement of quantum bits.

Consistent with some embodiments of this disclosure, the non-superconductor phase and the superconductor phase in the aluminum titanium nitride material can be controlled to be subjected to spinodal decomposition. For example, a nano-sized non-superconducting phase can be spontaneously formed in the aluminum titanium nitride material, and the disorderliness of chemical components and the disorderliness of carrier concentration can be simultaneously realized in the same aluminum titanium nitride material to achieve the effect of increasing the kinetic inductance and reducing the design area. When the such an inductance element is utilized for circuit design, the high kinetic inductance can have a smaller design area and smaller parasitic capacitance, thereby effectively improving the quality and efficiency of circuit design.

Consistent with some embodiments of this disclosure, an inductance element is provided, which can be prepared using methods illustrated and described in association with FIGS. 1-10. Consistent with some embodiments of this disclosure, a superconducting circuit is provided, which can include the inductance element described herein in association with FIGS. 1-10.

Figure 11:
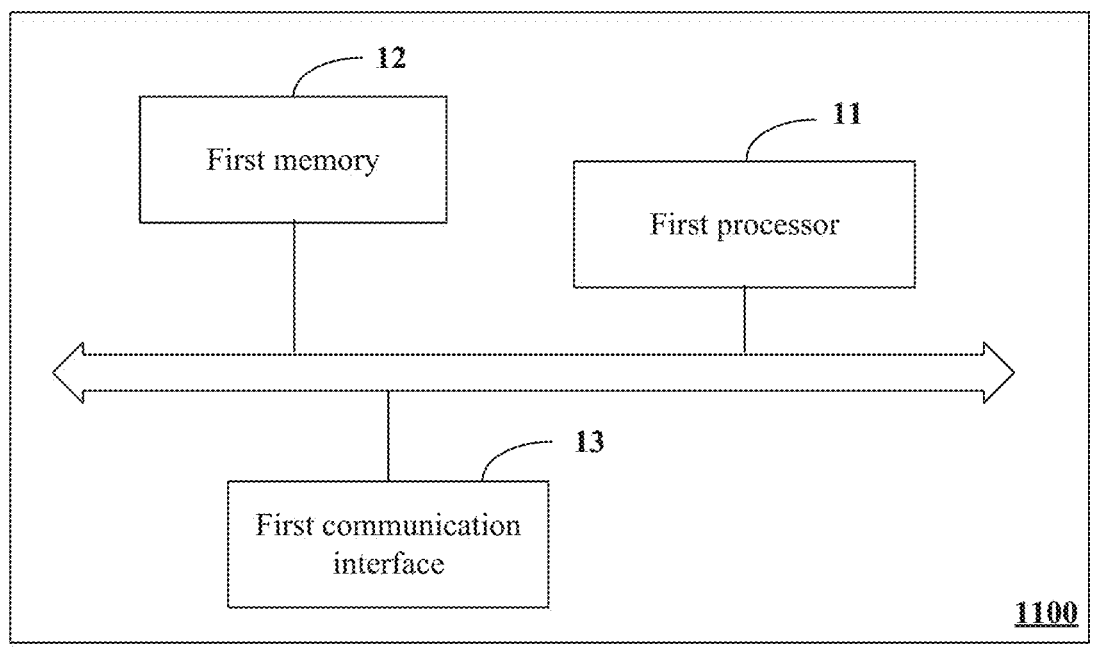
FIG. 11 is a schematic structural diagram illustrating an example device for preparing an inductance element, consistent with some embodiments of this disclosure.

By way of example, FIG. 11 is a schematic structural diagram illustrating an example device 1100 for preparing an inductance element, consistent with some embodiments of this disclosure. Device 1100 can be configured to prepare an inductance element described herein in association with FIGS. 1-10. As shown in FIG. 11, device 1100 can include first processor 11 and first memory 12. First memory 12 can be configured to store a program for device 1100 to perform one or more methods illustrated and described in association with FIGS. 1-10. First processor 11 can be configured to execute the program stored in first memory 12. For example, the program can include one or more computer instructions. When the one or more computer instructions are executed by first processor 11, the one or more methods illustrated and described in association with FIGS. 1-10 can be implemented. Device 1100 can further include a first communication interface 13 to communicate with another device or a communication network.

Consistent with some embodiments of this disclosure, a non-transitory computer storage medium for storing computer software instructions used by an electronic device (e.g., device 1100) is provided, which can include a program involved for performing the one or more methods illustrated and described in association with FIGS. 1-10.

Figure 12:
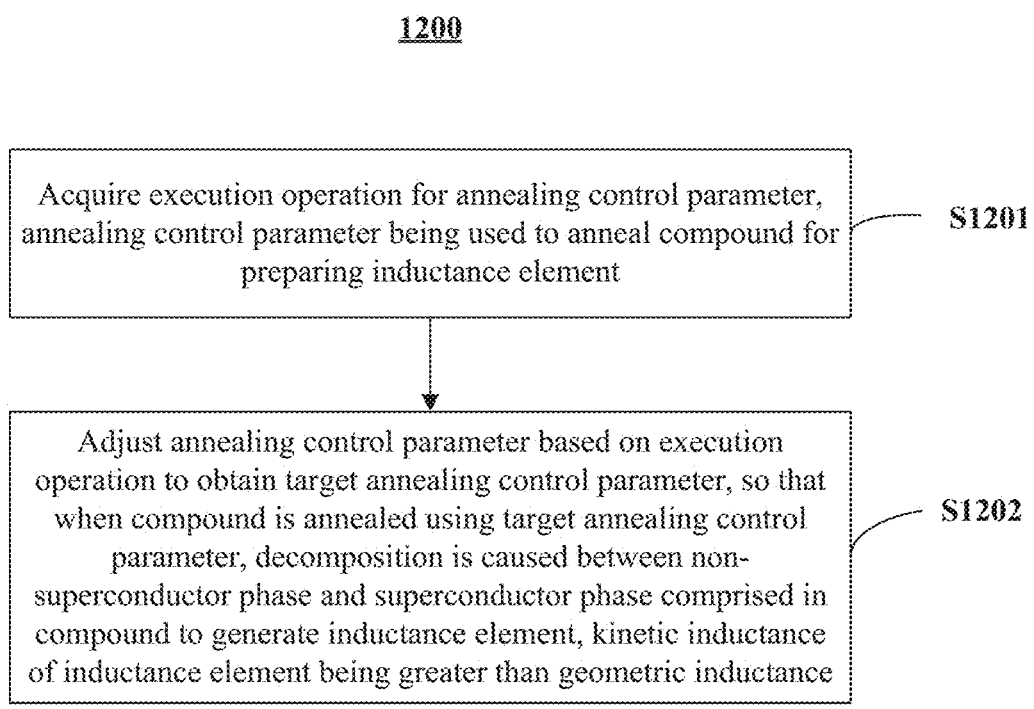
FIG. 12 is a flowchart of an example method for parameter configuration, consistent with some embodiments of this disclosure.

By way of example, FIG. 12 is a flowchart of an example method 1200 for parameter configuration, consistent with some embodiments of this disclosure. Method 1200 can be performed to configure an annealing control parameter for annealing a compound. Method 1200 can be executed by an apparatus for parameter configuration. It is understandable that the apparatus for parameter configuration can be implemented as software or a combination of software and hardware. Method 1200 includes steps S1201 and S1202.

At step S1201, an execution operation (e.g., input by a user) for an annealing control parameter can be acquired. The annealing control parameter can be used to anneal a compound for preparing an inductance element.

At step S1202, the annealing control parameter can be adjusted based on the execution operation to obtain a target annealing control parameter, so that when the compound is annealed using the target annealing control parameter, decomposition is caused between a non-superconductor phase and a superconductor phase included in the compound to generate the inductance element. The kinetic inductance of the inductance element can be greater than its geometric inductance.

In method 1200, the annealing control parameter can include parameter information for controlling an annealing operation. In some embodiments, the annealing control parameter can include at least one of an annealing temperature or an annealing time. That is, the annealing control parameter can include an annealing temperature, an annealing time, or an annealing temperature and an annealing time. The annealing temperature can be lower than a melting point temperature of the compound and higher than a preset temperature threshold corresponding to the compound. For example, the preset temperature threshold can be a minimum temperature at which the non-superconductor phase and the superconductor phase in the compound are decomposed. It is understandable that different compounds can correspond to different preset temperature thresholds.

In some embodiments, at step S1201, the apparatus for parameter configuration can include a signal receiver for acquiring the execution operation. For example, when a user inputs the execution operation for the annealing control parameter (e.g., including at least one of an annealing temperature or an annealing time) through the signal receiver, the apparatus for parameter configuration can acquire the execution operation for the annealing control parameter. The execution operation can be any operation for setting the annealing control parameter. After the execution operation for the annealing control parameter is obtained, the annealing control parameter can be set based on the execution operation. After the set annealing control parameter is obtained, the compound can be annealed based on the annealing control parameter to cause the decomposition between the non-superconductor phase and the superconductor phase included in the compound such that the inductance element can be generated. The kinetic inductance of the inductance element can be greater than its geometric inductance.

As illustrated and described in association with FIG. 12, an execution operation for an annealing control parameter can be acquired, and the annealing control parameter can be adjusted based on the execution operation to obtain a target annealing control parameter, so that when the compound is annealed using the target annealing control parameter, decomposition can be caused between a non-superconductor phase and a superconductor phase included in the compound to generate the inductance element with its kinetic inductance being greater than its geometric inductance. By doing so, the quality and efficiency of configuration of the inductance element can be effectively ensured, and the flexibility, reliability, and practicality of method 1200 can be improved.

Figure 13:
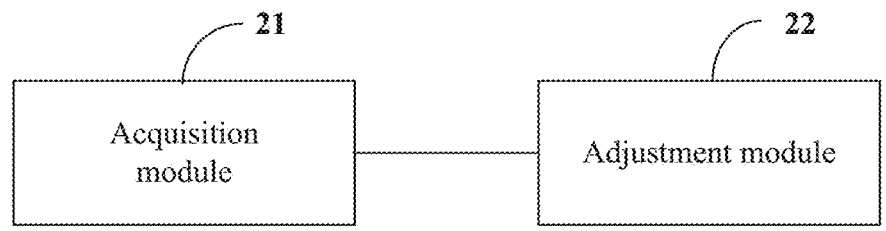
FIG. 13 is a schematic structural diagram illustrating an example apparatus for parameter configuration, consistent with some embodiments of this disclosure.

By way of example, FIG. 13 is a schematic structural diagram illustrating an example apparatus 1300 for parameter configuration, consistent with some embodiments of this disclosure. Apparatus 1300 can be used to configure an annealing control parameter for annealing a compound. It is understandable that apparatus 1300 can be implemented as software or a combination of software and hardware.

In FIG. 13, apparatus 1300 includes an acquisition module 21 configured to acquire an execution operation (e.g., input by a user) for an annealing control parameter. The annealing control parameter can be used to anneal a compound for preparing an inductance element.

Apparatus 1300 further includes an adjustment module 22 configured to configure the annealing control parameter based on the execution operation to obtain a target annealing control parameter, so that when the compound is annealed using the target annealing control parameter, decomposition can be caused between a non-superconductor phase and a superconductor phase included in the compound to generate the inductance element. The kinetic inductance of the inductance element can be greater than its geometric inductance.

In some embodiments, apparatus 1300 can be used to execute method 1200 of FIG. 12. For parts not described in detail in FIG. 13, references can be made to the related description of FIG. 12. For the execution process and technical effects of apparatus 1300, references can be made to the related description of FIG. 12.

Figure 14:
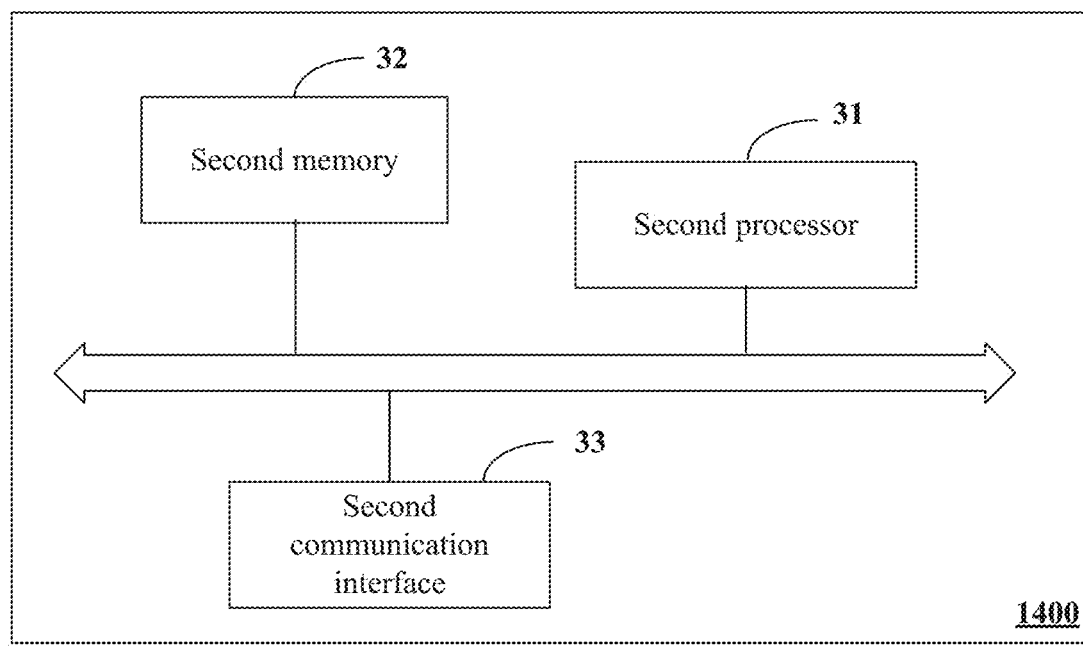
FIG. 14 is a schematic structural diagram illustrating an electronic device corresponding to the apparatus for parameter configuration in FIG. 13.

By way of example, FIG. 14 is a schematic structural diagram illustrating an electronic device 1400 corresponding to apparatus 1300 in FIG. 13. For example, apparatus 1300 in FIG. 13 can be implemented as electronic device 1400. As shown in FIG. 14, electronic device 1400 can include second processor 31 and second memory 32. Second memory 32 can be configured to store a program for supporting electronic device 1400 to perform method 1200 in FIG. 12. Second processor 31 can be configured to execute the program stored in second memory 32. For example, second processor 31 can be configured to execute all or part of the steps of method 1200 in FIG. 12. Electronic device 1400 can further include second communication interface 33 to communicate with another device or a communication network.

The program stored in second memory 32 can include one or more computer instructions. In some embodiments, when executing the one or more computer instructions, second processor 31 can acquire an execution operation (e.g., input by a user) for an annealing control parameter. The annealing control parameter can be used to anneal a compound for preparing an inductance element. Then, second processor 31 can adjust the annealing control parameter based on the execution operation to obtain a target annealing control parameter, so that when the compound is annealed using the target annealing control parameter, decomposition can be caused between a non-superconductor phase and a superconductor phase included in the compound to generate the inductance element. A kinetic inductance of the inductance element can be greater than its geometric inductance.

Consistent with some embodiments of this disclosure, a non-transitory computer storage medium for storing computer software instructions used by an electronic device (e.g., electronic device 1400) is provided, which can include a program involved for performing method 1200 in FIG. 12.

The embodiments of this disclosure can further be described using the following clauses:

1. A method of preparing an inductance element, comprising:
acquiring a compound for preparing an inductance element, a superconducting coherence length and a magnetic field penetration depth of the compound meeting a preset condition; and
annealing the compound to cause decomposition between a non-superconductor phase and a superconductor phase in the compound to generate the inductance element, the kinetic inductance of the inductance element being greater than the geometric inductance of the inductance element.

2. The method of clause 1, wherein the preset condition comprises that the superconducting coherence length is shorter than the magnetic field penetration depth.

3. The method of any of clauses 1-2, further comprising:
acquiring an execution operation for the preset condition; and
configuring the preset condition based on the execution operation.

4. The method of any of clauses 1-3, wherein the non-superconductor phase is nano-sized.

5. The method of any of clauses 1-4, wherein the geometric inductance is related to a fine structure constant of the inductance element.

6. The method of any of clauses 1-5, wherein acquiring the compound for preparing the inductance element comprises:
acquiring a raw material for preparing the inductance element; and
performing thin film deposition on the raw material to acquire the compound.

7. The method of any of clauses 1-6, wherein annealing the compound to cause the decomposition between the non-superconductor phase and the superconductor phase in the compound to generate the inductance element comprises:
acquiring an annealing control parameter; and
controlling to anneal the compound based on the annealing control parameter to cause the decomposition between the non-superconductor phase and the superconductor phase in the compound to generate the inductance element.

8. The method of clause 7, wherein the annealing control parameter comprises at least one of an annealing temperature or an annealing time.

9. The method of clause 8, wherein the annealing temperature is lower than a melting point temperature of the compound and higher than a preset temperature threshold corresponding to the compound, and wherein the preset temperature threshold is a minimum temperature at which the non-superconductor phase and the superconductor phase in the compound are decomposed.

10. The method of any of clauses 8-9, wherein a degree of decomposition between the non-superconductor phase and the superconductor phase is directly proportional to the annealing temperature.

11. The method of any of clauses 8-9, wherein a degree of decomposition between the non-superconductor phase and the superconductor phase is directly proportional to the annealing time.

12. The method of any of clauses 8-9, wherein a degree of decomposition between the non-superconductor phase and the superconductor phase is inversely proportional to the annealing time.

13. The method of any of clauses 7-12, wherein acquiring the annealing control parameter comprises:
acquiring a plurality of candidate control parameters for controlling an annealing operation, wherein under the control of the plurality of candidate control parameters, the inductance element corresponds to a plurality of different kinetic inductances; and
determining the annealing control parameter among the plurality of candidate control parameters to maximize the kinetic inductance of the inductance element.

14. The method of clause 13, wherein acquiring the plurality of candidate control parameters for controlling the annealing operation comprises:

determining the non-superconductor phase and the superconductor phase in the compound;

acquiring an annealing parameter range corresponding to the non-superconductor phase and the superconductor phase, the annealing parameter range being a parameter range corresponding to spontaneous decomposition between the non-superconductor phase and the superconductor phase; and acquiring the plurality of candidate control parameters for controlling the annealing operation within the annealing parameter range.

15. The method of any of clauses 7-14, further comprising:

acquiring an execution operation for the annealing control parameter; and setting the annealing control parameter based on the execution operation.

16. The method of any of clauses 7-15, wherein controlling to anneal the compound based on the annealing control parameter to cause the decomposition between the non-superconductor phase and the superconductor phase in the compound to generate the inductance element comprises:

controlling feature information of the compound based on the annealing control parameter to cause the decomposition between the non-superconductor phase and the superconductor phase in the compound to generate the inductance element.

17. The method of clause 16, wherein the feature information of the compound comprises at least one of a size feature of the non-superconductor phase, a crystallinity feature of the non-superconductor phase, or a distribution feature of the non-superconductor phase.

18. The method of any of clauses 1-17, wherein the compound comprises aluminum titanium nitride, the non-superconductor phase comprises aluminum nitride, and the superconductor phase comprises titanium nitride.

19. The method of any of clauses 1-17, wherein the non-superconductor phase and the superconductor phase comprise at least one identical chemical element.

20. An inductance element, wherein the inductance element is prepared using the method of any of clauses 1-19.

21. A superconducting circuit, comprising the inductance element of clause 20.

22. A quantum chip, comprising the inductance element of clause 20.

23. A device for preparing an inductance element, comprising:

a memory configured to store one or more computer-readable instructions; and one or more processors, wherein when the one or more computer-readable computer instructions are executed by the one or more processors, the one or more processors cause the device to perform a method, the method comprising:

acquiring a compound for preparing an inductance element, a superconducting coherence length and a magnetic field penetration depth of the compound meeting a preset condition; and annealing the compound to cause decomposition between a non-superconductor phase and a superconductor phase in the compound to generate the inductance element, the kinetic inductance of the inductance element being greater than the geometric inductance of the inductance element.

24. A method for parameter configuration, comprising:

acquiring an execution operation for an annealing control parameter, the annealing control parameter being used to anneal a compound for preparing an inductance element; and adjusting the annealing control parameter based on the execution operation to obtain a target annealing control parameter, so that when the compound is annealed using the target annealing control parameter, decomposition is caused between a non-superconductor phase and a superconductor phase in the compound to generate the inductance element, the kinetic inductance of the inductance element being greater than the geometric inductance of the inductance element.

25. A non-transitory computer-readable medium storing a set of instructions that is executable by at least one processor of an apparatus to cause the apparatus to perform a method, the method comprising:

acquiring an execution operation for an annealing control parameter, the annealing control parameter being used to anneal a compound for preparing an inductance element; and adjusting the annealing control parameter based on the execution operation to obtain a target annealing control parameter, so that when the compound is annealed using the target annealing control parameter, decomposition is caused between a non-superconductor phase and a superconductor phase in the compound to generate the inductance element, the kinetic inductance of the inductance element being greater than the geometric inductance of the inductance element.

26. An electronic device, comprising a memory configured to store one or more computer-readable instructions; and one or more processors, wherein when the one or more computer-readable computer instructions are executed by the one or more processors, the one or more processors cause the device to perform a method, the method comprising:

acquiring an execution operation for an annealing control parameter, the annealing control parameter being used to anneal a compound for preparing an inductance element; and adjusting the annealing control parameter based on the execution operation to obtain a target annealing control parameter, so that when the compound is annealed using the target annealing control parameter, decomposition is caused between a non-superconductor phase and a superconductor phase in the compound to generate the inductance element, the kinetic inductance of the inductance element being greater than the geometric inductance of the inductance element.

27. An apparatus for parameter configuration, comprising:

an acquisition module configured to acquire an execution operation for an annealing control parameter, the annealing control parameter being used to anneal a compound for preparing an inductance element; and an adjustment module configured to configure the annealing control parameter based on the execution operation to obtain a target annealing control parameter, so that when the compound is annealed using the target annealing control parameter, decomposition is caused between a non-superconductor phase and a superconductor phase in the compound to generate the inductance element, the kinetic inductance of the inductance element being greater than the geometric inductance of the inductance element.

It should be noted that the embodiments described herein are only schematic, where the units described as separate components can or cannot be physically separated, and the units displayed as units can or cannot be physical units. That is, they can be located in one place, or can be distributed to a plurality of network units. Some or all of the modules can be selected in accordance with actual needs to realize the objectives of the solution of this disclosure. Those of ordinary skill in the art can understand and implement them without creative efforts.

From the description of the implementations herein, those skilled in the art can clearly understand that the various implementations can be implemented by means of a general hardware platform or by means of a combination of hardware and software. Based on such understanding, the above technical solution or portions thereof can be essentially embodied in the form of a computer product, such as a computer program product implemented on one or more non-transitory computer-usable storage media (including, but not limited to, a magnetic disk memory, a CD-ROM, an optical memory, and the like) including computer-usable program code.

The present disclosure is described with reference to flowcharts and/or block diagrams of methods, devices, systems, and computer program products in accordance with embodiments of the present disclosure. It should be understood that each flow and/or block in the flowcharts and/or block diagrams and a combination of flows and/or blocks in the flowcharts and/or block diagrams can be implemented by computer program instructions. These computer program instructions can be provided to a processor of a general-purpose computer, a special-purpose computer, an embedded processor, or another programmable device to produce a machine, so that the instructions executed by the processor of the computer or another programmable device produce an apparatus for realizing the functions specified in one or more flows of the flowcharts and/or one or more blocks of the block diagrams.

These computer program instructions can also be stored in a non-transitory computer-readable memory that can direct the computer or another programmable device to work in a specific manner, so that the instructions stored in this computer-readable memory produce an article of manufacture including an instruction apparatus which implements the functions specified in one or more flows of the flowcharts and/or one or more blocks of the block diagrams.

These computer program instructions can also be loaded onto the computer or another programmable device, so that a series of operation steps are performed on the computer or another programmable device to produce computer-implemented processing, so that the instructions executed on the computer or another programmable device provide steps for implementing the functions specified in one or more flows of the flowcharts and/or one or more blocks of the block diagrams.

In a typical configuration, the computing device can include one or more central processing units (CPUs), an input/output interface, a network interface, and a memory. The memory can include a volatile memory, a Random Access Memory (RAM), and/or a non-volatile memory in computer-readable media, such as a Read-Only Memory (ROM) or a flash RAM. The memory is an example of the non-transitory computer-readable medium.

The non-transitory computer-readable medium includes permanent and non-permanent and removable and non-removable media, and can store information by any method or technology. The information can be computer-readable instructions, data patterns, program modules, or other data. Examples of computer storage media include, but are not limited to, a phase change memory (PRAM), a static random access memory (SRAM), a dynamic random access memory (DRAM), other types of random access memories (RAM), a read-only memory (ROM), an electrically erasable programmable read-only memory (EEPROM), a flash memory or other memory technologies, a read-only compact disc read-only memory (CD-ROM), a digital versatile disk (DVD) or other optical storage, a magnetic tape cassette, magnetic tape magnetic disk storage or other magnetic storage devices, or any other non-transmission media, and the computer storage media can be used to store information that can be accessed by computing devices. As defined herein, the computer-readable medium does not include temporary computer-readable media (e.g., transitory media), such as a modulated data signal and a carrier.

Finally, it should be noted that the above examples are only used to describe the technical solution of the present disclosure, not to limit it. Although the present disclosure has been described in detail with reference to the foregoing embodiments, those of ordinary skill in the art will appreciate that the technical solution recorded in the foregoing embodiments can still be modified, or some of the technical features thereof can be equivalently substituted. Such modifications and substitutions do not make the essence of the corresponding technical solution depart from the spirit and scope of the technical solutions of the various embodiments of the present disclosure.

The invention claimed is:

1. A method for creating a quantum chip that includes a superconducting circuit, comprising:
   creating an inductance element having a kinetic inductance of the inductance element greater than a geometric inductance of the inductance element, creation comprising:
       acquiring an aluminum titanium nitride compound for preparing the inductance element, a superconducting coherence length and a magnetic field penetration depth of the aluminum titanium nitride compound meeting a preset condition; and
       decomposing, by annealing, the aluminum titanium nitride compound into an aluminum nitride non-superconductor phase and a titanium nitride superconductor phase;
   determining the kinetic inductance of the inductance element using a microwave resonator; and
   incorporating the inductance element into the superconducting circuit, a configuration of the superconducting circuit based on the determined kinetic inductance of the inductance element.

2. The method of claim 1, wherein the preset condition comprises that the superconducting coherence length is shorter than the magnetic field penetration depth.

3. The method of claim 1, further comprising:
   acquiring an execution operation for the preset condition; and
   configuring the preset condition based on the execution operation.

4. The method of claim 1, wherein the aluminum nitride non-superconductor phase is nano-sized.

5. The method of claim 1, wherein the geometric inductance is related to a fine structure constant of the inductance element.

6. The method of claim 1, wherein acquiring the aluminum titanium nitride compound for preparing the inductance element comprises:
acquiring a raw material for preparing the inductance element; and
performing thin film deposition on the raw material to acquire the compound.

7. The method of claim 1, wherein creating the inductance element further comprises:
acquiring an annealing control parameter; and
wherein the aluminum titanium nitride compound is decomposed by annealing in accordance with the annealing control parameter.

8. The method of claim 7, wherein the annealing control parameter comprises at least one of an annealing temperature or an annealing time.

9. The method of claim 8, wherein the annealing temperature is lower than a melting point temperature of the aluminum titanium nitride compound and higher than a preset temperature threshold corresponding to the aluminum titanium nitride compound, and wherein the preset temperature threshold is a minimum temperature at which the aluminum nitride non-superconductor phase and the titanium nitride superconductor phase in the aluminum titanium nitride compound are decomposed.

10. The method of claim 8, wherein a degree of decomposition after annealing between the aluminum nitride non-superconductor phase and the titanium nitride superconductor phase is directly proportional to the annealing temperature.

11. The method of claim 8, wherein a degree of decomposition after annealing between the aluminum nitride non-superconductor phase and the titanium nitride superconductor phase is directly proportional to the annealing time.

12. The method of claim 8, wherein a degree of decomposition after annealing between the aluminum nitride non-superconductor phase and the titanium nitride superconductor phase is inversely proportional to the annealing time.

13. The method of claim 7, wherein acquiring the annealing control parameter comprises:
acquiring a plurality of candidate control parameters for controlling an annealing operation, wherein under the control of the plurality of candidate control parameters, the inductance element corresponds to a plurality of different kinetic inductances; and
determining the annealing control parameter among the plurality of candidate control parameters to maximize the kinetic inductance of the inductance element.

14. The method of claim 13, wherein acquiring the plurality of candidate control parameters for controlling the annealing operation comprises:
acquiring an annealing parameter range corresponding to the aluminum nitride non-superconductor phase and the titanium nitride superconductor phase, the annealing parameter range being a parameter range corresponding to spontaneous decomposition between the aluminum nitride non-superconductor phase and the titanium nitride superconductor phase; and
acquiring the plurality of candidate control parameters for controlling the annealing operation within the annealing parameter range.

15. The method of claim 7, further comprising:
acquiring an execution operation for the annealing control parameter; and
setting the annealing control parameter based on the execution operation.

16. The method of claim 7, wherein:
the annealing control parameter determines feature information of the decomposed aluminum titanium nitride compound.

17. The method of claim 16, wherein the feature information of the aluminum titanium nitride compound comprises at least one of a size feature of the aluminum nitride non-superconductor phase, a crystallinity feature of the aluminum nitride non-superconductor phase, or a distribution feature of the aluminum nitride non-superconductor phase.

18. The method of claim 1, wherein the compound comprises $Ti_{0.5}Al_{0.5}N$.

19. The method of claim 1, wherein the aluminum nitride non-superconductor phase and the titanium nitride superconductor phase comprise at least one identical chemical element.

20. A quantum chip, comprising:
a superconducting circuit, the superconducting circuit including an inductance element, the inductance element comprising an annealed film of an aluminum titanium nitride compound, the annealed film including:
non-superconductor phase portions comprising aluminum nitride; and
superconducting phase portions comprising titanium nitride.

21. The quantum chip of claim 20, wherein:
the annealed film of the aluminum titanium nitride compound comprises a spinodally decomposed sputtered film of the aluminum titanium nitride compound.

22. The quantum chip of claim 20, wherein:
the aluminum titanium nitride compound comprises $Ti_{0.5}Al_{0.5}N$.

23. The quantum chip of claim 20, wherein:
a kinetic inductance of the inductance element is greater than a geometric inductance of the inductance element.

* * * * *